(12) United States Patent
Matsuura et al.

(10) Patent No.: US 7,493,091 B2
(45) Date of Patent: Feb. 17, 2009

(54) TRANSMISSION CIRCUIT AND COMMUNICATION DEVICE

(75) Inventors: Toru Matsuura, Osaka (JP); Hisashi Adachi, Osaka (JP); Kaoru Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 461 days.

(21) Appl. No.: 11/477,855

(22) Filed: Jun. 30, 2006

(65) Prior Publication Data
US 2007/0013567 A1     Jan. 18, 2007

(30) Foreign Application Priority Data

| Jun. 30, 2005 | (JP) | ............................. 2005-192679 |
| Jun. 29, 2006 | (JP) | ............................. 2006-178924 |

(51) Int. Cl.
*H04B 1/02* (2006.01)
*H04B 1/04* (2006.01)

(52) U.S. Cl. .................... 455/91; 455/114.2; 455/127.1

(58) Field of Classification Search .................. 455/91, 455/108, 126, 127.1, 127.2, 114.2, 501, 63.1, 455/67.13, 570; 375/295, 296, 300; 330/10, 330/136
See application file for complete search history.

(56) References Cited

U.S. PATENT DOCUMENTS

| 4,947,455 | A  * | 8/1990  | Swanson   ................. 455/127.1 |
| 6,256,482 | B1 * | 7/2001  | Raab       .......................... 455/108 |
| 6,636,112 | B1   | 10/2003 | McCune |
| 6,647,073 | B2 * | 11/2003 | Tapio      ......................... 375/297 |
| 6,661,363 | B2   | 12/2003 | Zierhofer |
| 7,010,280 | B1 * | 3/2006  | Wilson     ........................ 455/126 |
| 7,116,947 | B2 * | 10/2006 | Tanabe et al.   ................. 455/91 |
| 7,139,534 | B2 * | 11/2006 | Tanabe et al.   ............... 455/108 |

(Continued)

FOREIGN PATENT DOCUMENTS

JP      11-251934      9/1999

(Continued)

OTHER PUBLICATIONS

F. H. Raab et al., "High-Efficiency L-Band Kahn-Technique Transmitter", 1998 IEEE MTT-S Int. Microwave Symp. Dig., pp. 585-588.

(Continued)

*Primary Examiner*—Sonny Trinh
(74) *Attorney, Agent, or Firm*—Wenderoth, Lind & Ponack, L.L.P.

(57) ABSTRACT

A transmission circuit operating at a high efficiency and a low distortion is provided. A signal generation section 11 generates a vector signal and an amplitude signal. A vector modulation section 13 performs vector modulation on the vector signal. An amplification section 15 amplifies the signal processed with the vector modulation. A signal processing section 12 performs predetermined signal processing on the amplitude signal and outputs the resultant signal. A regulator 14 controls a voltage to be supplied to the amplification section 15 based on the magnitude of the signal which is output from the signal processing section 12. The signal processing section 12 determines whether or not the amplitude signal exceeds a threshold value at an interval of a predetermined time period, selects a discrete value to be output based on the determination result, and outputs a signal having the selected discrete value.

25 Claims, 35 Drawing Sheets

U.S. PATENT DOCUMENTS

| | | | |
|---|---|---|---|
| 7,373,114 B2 * | 5/2008 | Yagyu et al. | 455/78 |
| 2004/0185803 A1 | 9/2004 | Tanabe et al. | |
| 2007/0129032 A1 * | 6/2007 | Matsuura et al. | 455/127.2 |
| 2008/0031381 A1 * | 2/2008 | Matsuura et al. | 375/297 |
| 2008/0031384 A1 * | 2/2008 | Hara et al. | 375/300 |
| 2008/0068240 A1 * | 3/2008 | Matsuura | 341/143 |

FOREIGN PATENT DOCUMENTS

| | | |
|---|---|---|
| JP | 2004-173249 | 6/2004 |
| JP | 2004-289812 | 10/2004 |
| JP | 2006-86916 | 3/2006 |
| WO | 2004/038937 | 5/2004 |

OTHER PUBLICATIONS

P. B. Kenington, High-Linearity RF Amplifier Design, pp. 426-512, Jan. 2000, Arch House Microwave Library (only relevant pages submitted).

* cited by examiner

F I G. 6 A
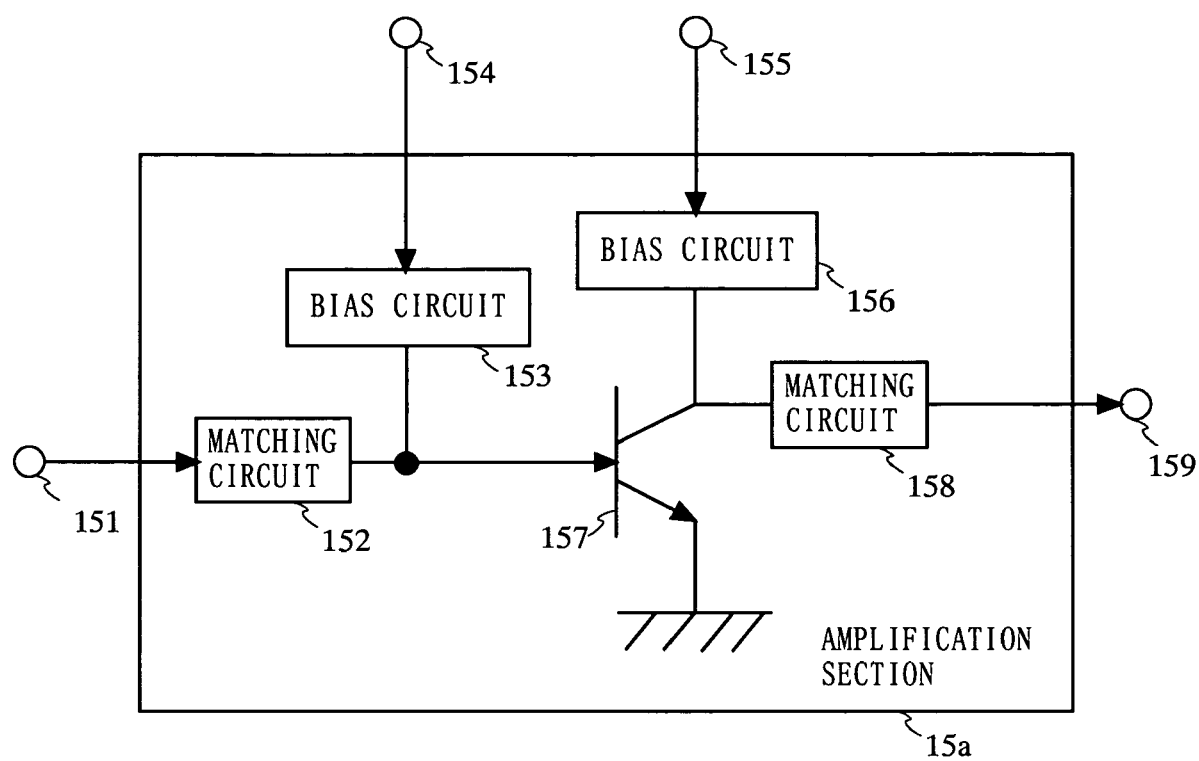

F I G. 8
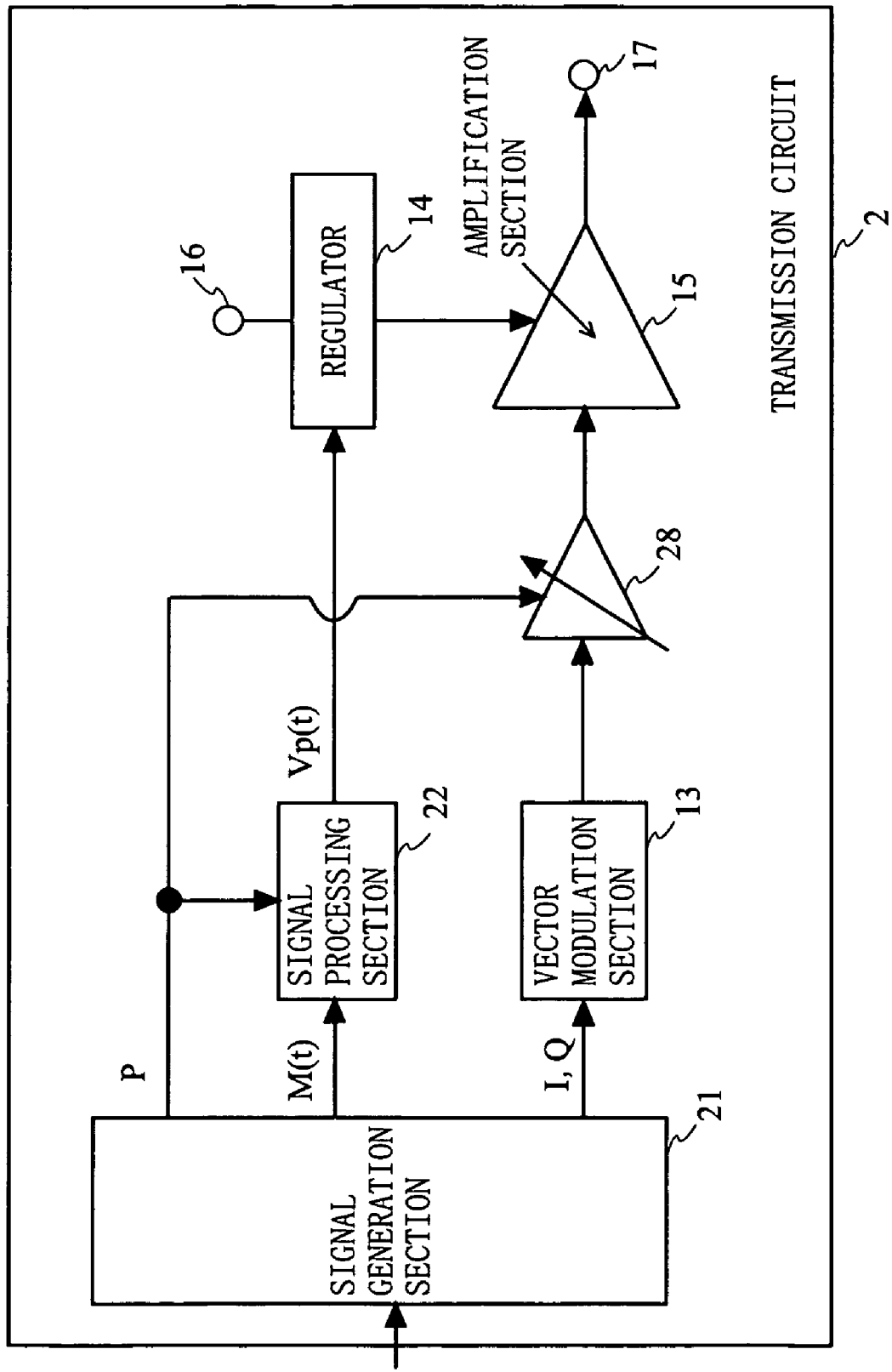

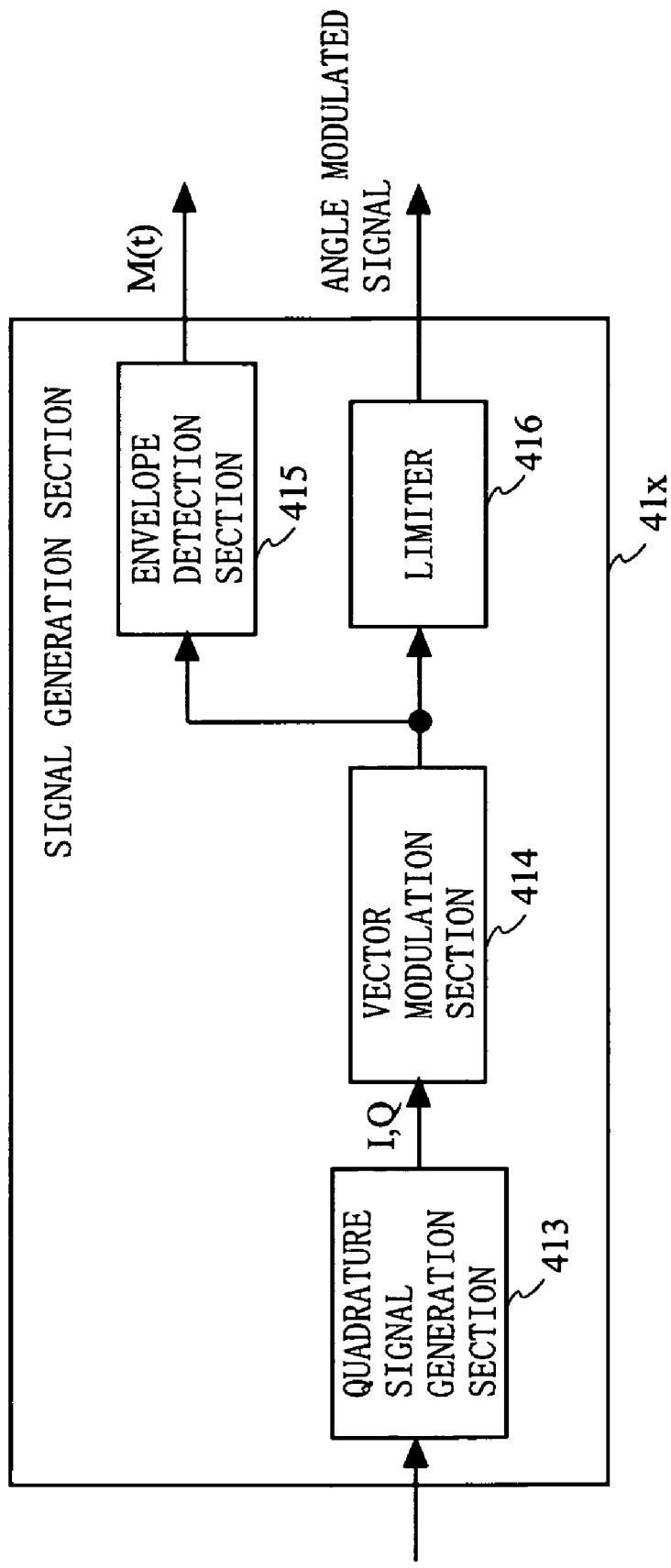
F I G. 20B

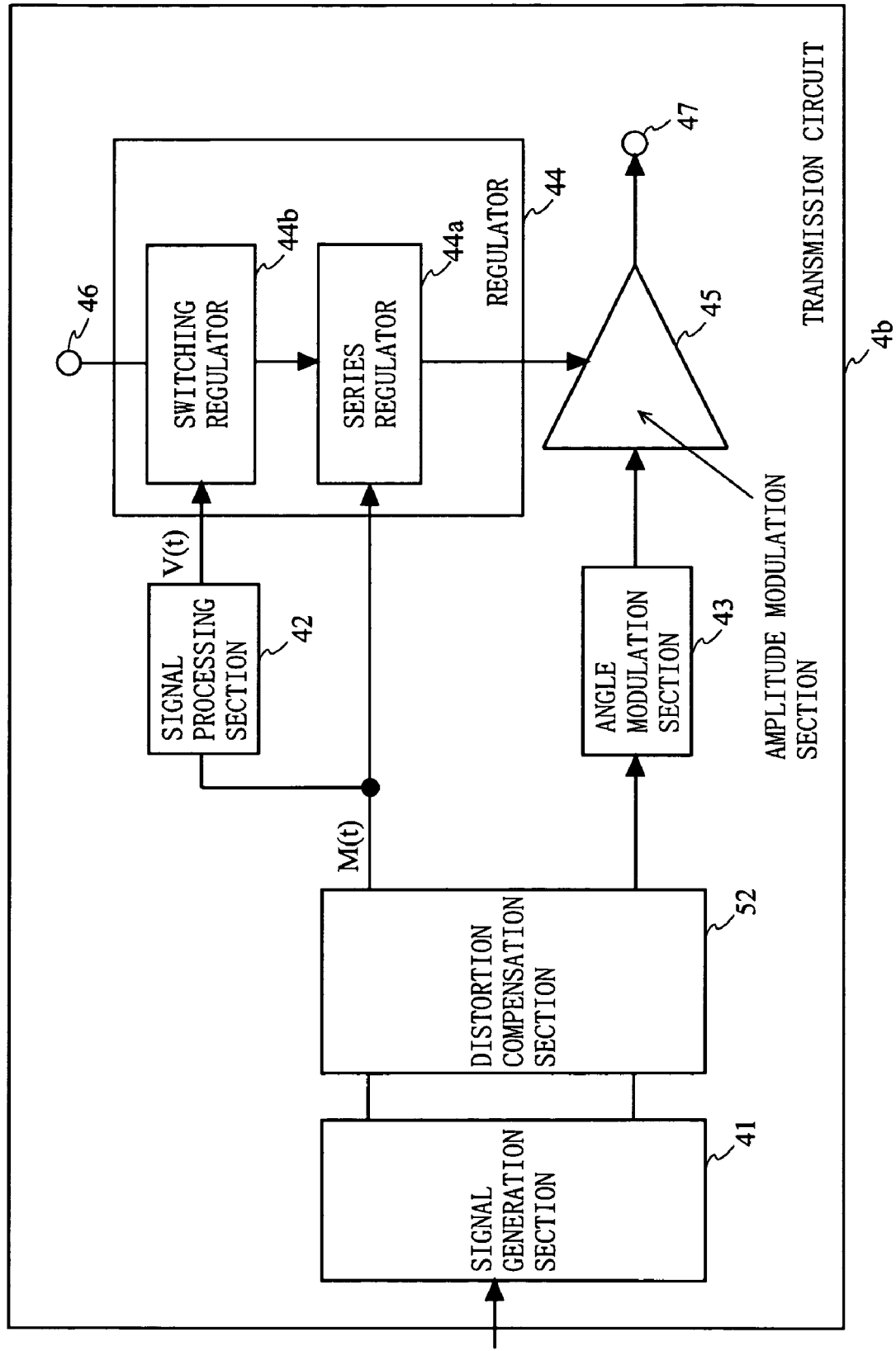
F I G. 2 7

F I G. 2 8
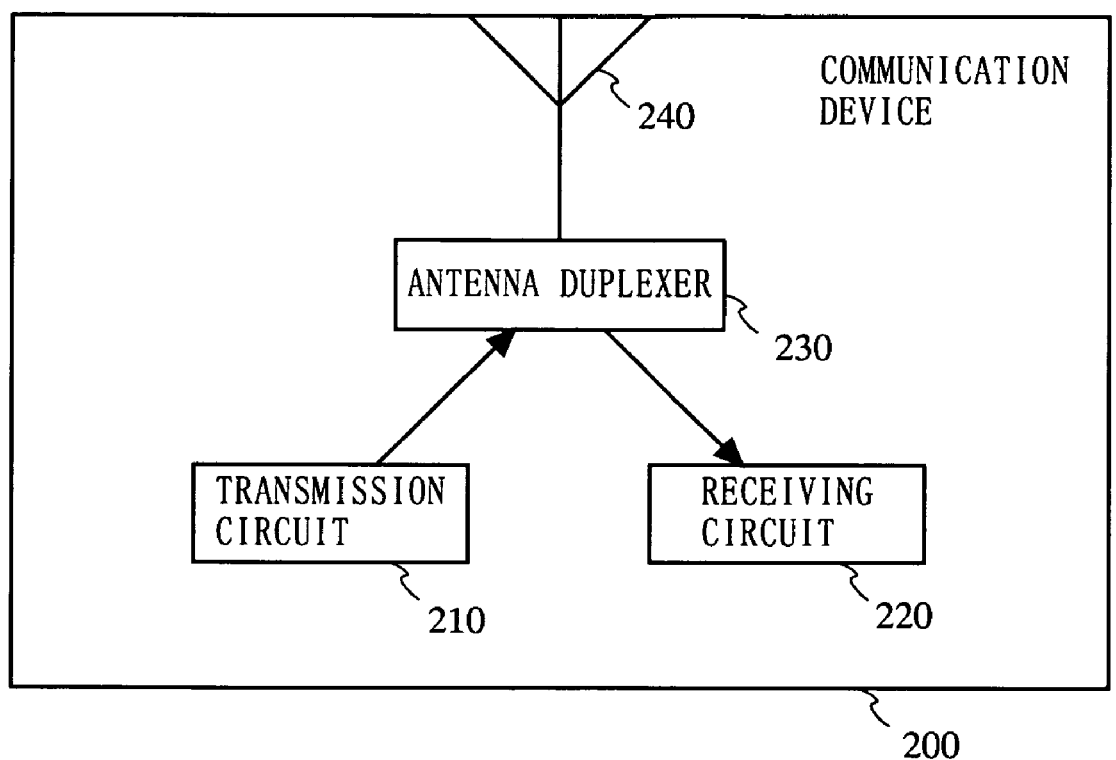

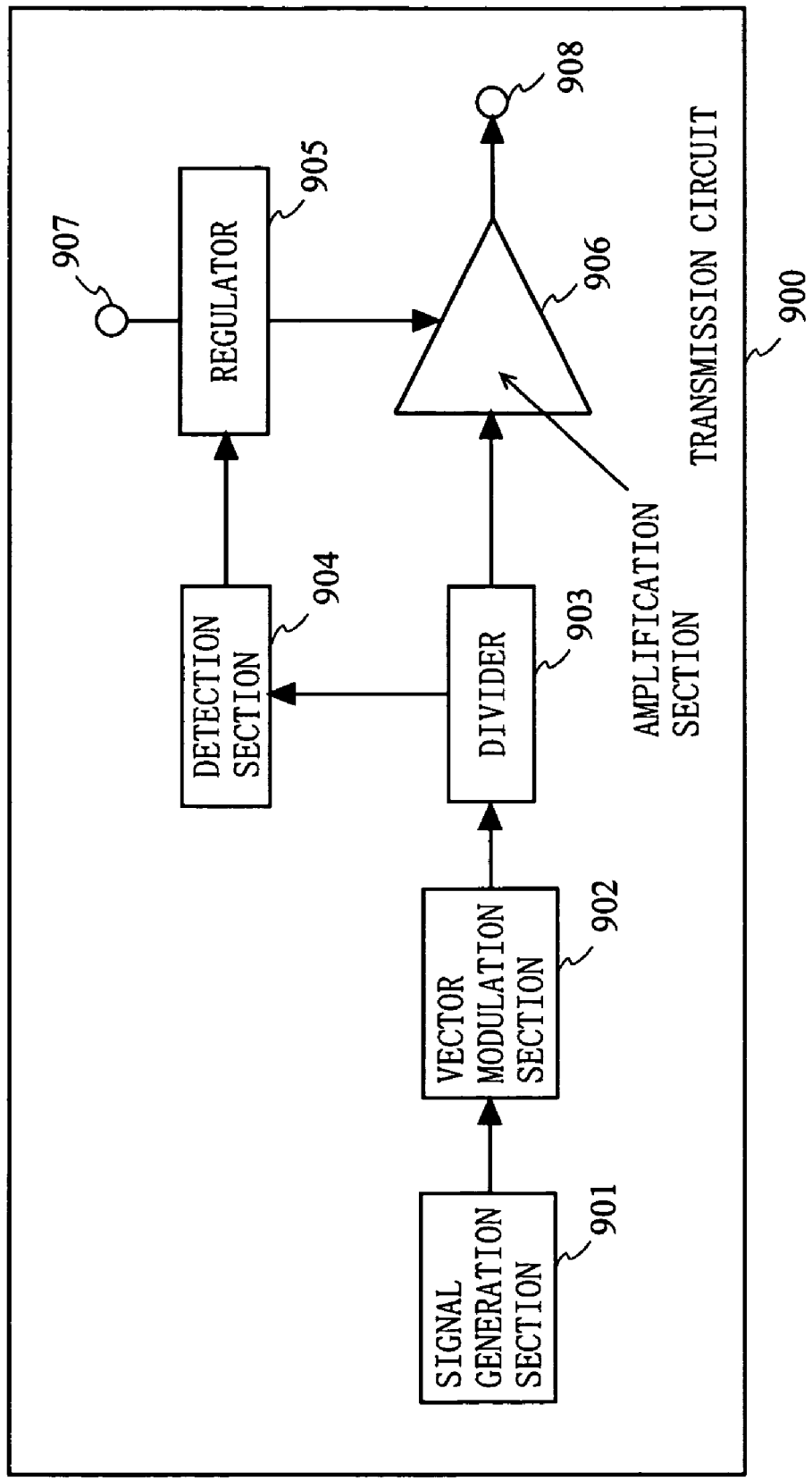
F I G. 2 9  PRIOR ART

TRANSMISSION CIRCUIT AND COMMUNICATION DEVICE

BACKGROUND OF THE INVENTION

1. Field of the Invention

The present invention relates to a transmission circuit usable for communication devices such as mobile phones and wireless LAN devices, and in particular to a transmission circuit operable at a high efficiency and a low distortion and a communication device using the same.

2. Description of the Background Art

Communication devices such as mobile phones and wireless LAN devices are required to guarantee a linearity of a transmission signal in a wide power amplification range and also to operate at low power consumption. For such a communication device, a transmission circuit operable at a high efficiency and a low distortion is used. Hereinafter, conventional transmission circuits will be described.

Conventionally, a transmission circuit for controlling the voltage to be supplied to an amplification section in accordance with the magnitude of an envelope of a modulated signal is disclosed (see, for example, non-patent document 1). FIG. 29 is a block diagram showing an exemplary structure of a conventional transmission circuit 900. In the conventional transmission circuit 900, a signal generation section 901 generates an in-phase signal and a quadrature-phase signal (herein after, such an in-phase signal and a quadrature-phase signal will be referred to as "I and Q signals"), which are quadrature signals. The I and Q signals are input to a vector modulation section 902. The vector modulation section 902 performs vector modulation on the I and Q signals and outputs the resultant signal as a modulated signal. As the vector modulation section 902, a quadrature modulator is typically used. The modulated signal which is output from the vector modulation section 902 is input to a detection section 904 and an amplification section 906 via a divider 903.

The detection section 904 detects the magnitude of the envelope of the modulated signal and outputs the detection signal to a regulator 905. The regulator 905 is supplied with a DC voltage from a power supply terminal 907. The regulator 905 supplies a voltage in accordance with the magnitude of the envelope of the modulated signal, which is detected by the detection section 904, to the amplification section 906. The amplification section 906 amplifies the modulated signal in accordance with the voltage supplied from the regulator 905. The modulated signal amplified by the amplification section 906 is output from an output terminal 908 as a transmission signal. In this way, the conventional transmission circuit 900 controls the voltage to be supplied to the amplification section 906 in accordance with the magnitude of the envelope of the modulated signal, and thus prevents the distortion characteristic of the modulated signal from being deteriorated by the amplification section 906 especially in the case where the envelope of the modulated signal which is output from the vector modulation section 902 is large.

A conventional transmission circuit for controlling the transmission power required for communication with a base station at each slot time in accordance with the W-CDMA system is disclosed (see, for example, patent document 1). FIG. 30 is a block diagram showing an exemplary structure of a conventional transmission circuit 910. In the conventional transmission circuit 910, a table referring section 913 has stored therein information on a power supply voltage at which an amplification section 916 always operates at a maximum efficiency, for each magnitude of the transmission power. A regulator 914 receives a voltage corresponding to an average power, which is obtained by averaging the transmission power in each slot time, via an input terminal 911 and the table referring section 913. The regulator 914 is also supplied with a DC voltage from a power supply terminal 915.

The regulator 914 reads the information on the power supply voltage corresponding to the input average power from the table referring section 913, and thus controls the voltage to be supplied to the amplification section 916. The amplification section 916 amplifies a modulated signal which is input via an input terminal 912 in accordance with the voltage supplied from the regulator 914. The modulated signal amplified by the amplification section 916 is output from an output terminal 917 as a transmission signal. In this way, the conventional transmission circuit 910 controls the voltage to be supplied to the amplification section 916 based on the average transmission power in each slot time, and thus operates at a high efficiency and a low distortion.

A conventional transmission circuit for generating a transmission signal using a modulation system such as a quadrature modulation system or the like is known (herein after, such a transmission circuit will be referred to as a "quadrature modulation circuit"). The quadrature modulation circuit is well known and will not be described herein. Non-patent document 2 discloses a conventional transmission circuit for outputting a transmission signal having a higher linearity at a higher efficiency than the quadrature modulation circuit. FIG. 31 is a block diagram showing an exemplary structure of a conventional transmission circuit 920 disclosed in non-patent document 2. As shown in FIG. 31, the conventional transmission circuit 920 includes a signal generation section 921, an angle modulation section 922, a power supply terminal 923, a regulator 924, an amplitude modulation section 925, and an output terminal 926. The signal generation section 921 generates an amplitude signal and a phase signal. The amplitude signal is input to the regulator 924. The regulator 924 is supplied with a DC voltage Vb from the power supply terminal 923. The regulator 924 supplies a voltage Vc controlled in accordance with the amplitude signal input thereto to the amplitude modulation section 925. The phase signal is input to the angle modulation section 922. The angle modulation section 922 performs angle modulation on the input phase signal and outputs an angle modulated signal. The angle modulated signal is input to the amplitude modulation section 925. The amplitude modulation section 925 performs amplitude modulation on the angle modulated signal with the voltage Vc supplied from the regulator 924, and outputs a modulated signal obtained as a result of angle modulation and amplitude modulation. The modulated signal is output from the output terminal 926 as a transmission signal. The transmission circuit 920 operable in this manner is referred to as a polar modulation circuit.

With the conventional transmission circuit 900 (see FIG. 29), the voltage supplied to the amplification section 906 is continuously varied by the envelope of the signal processed with vector modulation by the vector modulation section 902. Therefore, the amplification section 906 may possibly operate in a non-linear region (saturated region) as well as the linear region. For example, the amplification section 906 needs to be supplied with a voltage of a certain level or greater in order to maintain the linearity of the transmission signal. If the amplification section 906 is not supplied with a voltage of such a certain level or greater, the transmission circuit 900 cannot maintain the linearity of the output signal. Also when the envelope of the signal processed with vector modulation temporarily exceeds the linear region of the amplification section 906, the conventional transmission circuit 900 cannot maintain the linearity of the output signal.

The conventional transmission circuit 910 (see FIG. 30) controls the voltage to be supplied to the amplification section 916 using the average power in each slot time. Therefore, the transmission circuit 910 cannot deal with a sudden change in the power of the transmission signal and may not always operate at a high efficiency and a low distortion. For example, even when the average power in each slot time is high but is lower in a time period shorter than the slot time, the conventional transmission circuit 910 may possibly supply a voltage corresponding to the average voltage in each slot time to the amplification section 916. As a result, the power is wasted in the amplification section 916 and a high efficiency operation is not necessarily realized. By contrast, when the average power in each slot time is low but is higher in a time period shorter than the slot time, the power supplied to the amplification section 916 is not sufficient and thus the transmission signal may be distorted.

The conventional transmission circuit 920 (see FIG. 31) controls the voltage Vc which is output from the regulator 924 with the amplitude signal. Therefore, when the magnitude of the amplitude signal is small, the power lost by the regulator 924 is large and thus the efficiency of the transmission circuit is decreased. FIG. 32 shows a problem with the conventional transmission circuit 920. Referring to FIG. 32, a difference between the voltage Vb supplied from the power supply terminal 923 to the regulator 924 and the voltage Vc supplied from the regulator 924 to the amplitude modulation section 925 is the loss caused at the regulator 924. When the magnitude of the amplitude signal is small, the difference between the voltages Vb and Vc is large, which decreases the efficiency of the transmission circuit.

In order to reduce such a loss, patent document 2 discloses a conventional transmission circuit 930 in which a regulator includes a series regulator and a switching regulator. FIG. 33 is a block diagram showing an exemplary structure of the conventional transmission circuit 930 disclosed in patent document 2. As shown in FIG. 33, the conventional transmission circuit 930 includes a regulator 931 and an amplitude modulation section 932. The regulator 931 includes a switching regulator 933 and a series regulator 934. FIG. 34 shows an operation of the regulator 931 in the conventional transmission circuit 930. Referring to FIG. 34, the switching regulator 933 is supplied with power information which represents the magnitude of the power of a transmission signal to be output. The switching regulator 933 supplies a voltage Vs controlled in accordance with the power information to the series regulator 934. Since the frequency of the power information is lower than that of the amplitude signal, the switching regulator 933 can operate at a high efficiency. The series regulator 934 supplies a voltage Vc controlled in accordance with the magnitude of the amplitude signal to the amplitude modulation section 932. In this way, the switching regulator 933 supplies the voltage Vs controlled in accordance with the power information to the series regulator 934, and thus the conventional transmission circuit 930 reduces the loss in the regulator 931.

However, with the conventional transmission circuit 930 (see FIG. 33), the frequency of the power information is lower than that of the amplitude signal. Therefore, the operation of the switching regulator 933 does not follow a change in the amplitude signal. For this reason, the loss in the series regulator 934 cannot be sufficiently reduced. FIG. 35 shows a problem of the conventional transmission circuit 930. As shown in FIG. 35, with the conventional transmission circuit 930, there is still a difference between the voltage Vs supplied from the switching regulator 933 to the series regulator 934 and the voltage Vc supplied from the series regulator 934 to the amplitude modulation section 932. In a consequence, the conventional transmission circuit 930 cannot sufficiently reduce the loss in the series regulator 934, and the efficiency of the transmission circuit is still decreased.

Patent document 1: Japanese Laid-Open Patent Publication No. 11-251934

Patent document 2: U.S. Pat. No. 6,636,112

Non-patent document 1: P. B. Kenington, "High Linearity Rf Amplifier Design", Artch House Microwave Library, USA, January 2000, pp. 426-512

Non-patent document 2: F. H. Raab, et al., "High-efficiency L-band Kahn-technique transmitter", 1998, IEEE MTT-S Int. Microwave Symp. Dig.

SUMMARY OF THE INVENTION

Therefore, an object of the present invention is to provide a transmission circuit for solving the above-described problems which is operable at a high efficiency and a low distortion over a wide range of output power, and a communication device using the same.

The present invention is directed to a transmission circuit for generating a transmission signal based on input data and outputting the transmission signal. In order to attain the above object, the transmission circuit according to the present invention comprises a signal generation section for generating a vector signal including I and Q signals and an amplitude signal representing a magnitude of the vector signal, based on the input data; a vector modulation section for performing vector modulation on the vector signal; an amplification section for amplifying the signal processed with vector modulation by the vector modulation section; a signal processing section for performing predetermined signal processing on the amplitude signal and outputting the resultant signal; and a regulator for controlling a voltage to be supplied to the amplification section based on a magnitude of the signal which is output from the signal processing section. The signal processing section holds at least one threshold value and at least two discrete values corresponding to the threshold value; and determines whether or not the amplitude signal exceeds the threshold value at an interval of a predetermined time period, selects a discrete value to be output based on the determination result, and outputs a signal having the selected discrete value.

Preferably, the predetermined time period is shorter than a time period by which an average output power of the transmission circuit is controlled.

Preferably, the signal processing section includes a determination and quantization section for holding at least one threshold value and at least two discrete values corresponding to the threshold value, determining whether or not the amplitude signal exceeds the threshold value at an interval of the predetermined time period, selecting a discrete value to be output based on the determination result, and outputting a signal having the selected discrete value.

The determination and quantization section includes a maximum amplitude detection section for detecting a maximum value of the amplitude signal at an interval of the predetermined time period; and a quantization section for determining whether or not the maximum value of the amplitude signal exceeds the threshold value at an interval of the predetermined time period, selecting a discrete value to be output based on the determination result, and outputting a signal having the selected discrete value.

The signal generation section may further output power information which represents a magnitude of a transmission power of the transmission signal. In this case, the transmission circuit further comprises a variable gain amplification section for amplifying the signal processed with vector modulation by the vector modulation section with a gain in accordance with the power information. The signal processing section further includes a multiplication section for multiplying the power information and the amplitude signal to output an amplitude signal having a magnitude controlled in accordance with the power information to the determination and quantization section. Alternatively, the signal processing section may change levels of the threshold value and the discrete values based on the power information.

Preferably, the signal processing section changes the levels of the threshold value and the discrete values so as to be in inverse proportion to the square root of the magnitude of the transmission power. Alternatively, the signal processing section may change the levels of the threshold value and the discrete values, referring to table information in which the levels of the threshold value and the discrete values are preset to be optimum in correspondence with the magnitude of the transmission power. The transmission circuit may further comprise a distortion compensation section for compensating for the vector signal generated by the signal generation section so as to suppress a distortion occurring to the vector signal in the amplification section. The regulator is a series regulator or a switching regulator.

Preferably, the regulator includes a series regulator for supplying a voltage controlled in accordance with the magnitude of the signal which is output from the signal processing section to the amplification section; a calculation section for performing predetermined calculation processing on the signal which is output from the signal processing section and outputting the resultant signal; and a switching regulator for supplying a voltage controlled in accordance with a magnitude of the signal which is output from the calculation section to the series regulator. The calculation section performs calculation processing on the signal which is output from the signal processing section, such that the voltage which is output from the switching regulator is higher than the voltage which is output from the series regulator.

The transmission circuit may have the following structure. A transmission circuit comprises a signal generation section for generating a vector signal including I and Q signals, based on the input data; a vector modulation section for performing vector modulation on the vector signal; a dividing section for dividing the signal processed with vector modulation by the vector modulation section; an amplification section for amplifying one of the signals divided by the dividing section; a detection section for detecting a magnitude of an envelope of the other of the signals divided by the dividing section and outputting the detection result as an amplitude signal; a signal processing section for performing predetermined signal processing on the amplitude signal and outputting the resultant signal; and a regulator for controlling a voltage to be supplied to the amplification section based on a magnitude of the signal which is output from the signal processing section. The signal processing section holds at least one threshold value and at least two discrete values corresponding to the threshold value; and determines whether or not the amplitude signal exceeds the threshold value at an interval of a predetermined time period, selects a discrete value to be output based on the determination result, and outputs a signal having the selected discrete value.

Preferably, the transmission circuit comprises a signal generation section for generating an amplitude signal and an angle modulated signal based on the input data; an amplitude modulation section for performing amplitude modulation on the angle modulated signal; a series regulator for controlling a voltage to be supplied to the amplitude modulation section based on a magnitude of the amplitude signal generated by the signal generation section; a signal processing section for performing predetermined signal processing on the amplitude signal generated by the signal generation section and outputting the resultant signal; and a switching regulator for controlling a voltage to be supplied to the series regulator based on a magnitude of the signal which is output from the signal processing section. The signal processing section holds at least one threshold value and at least two discrete values corresponding to the threshold value; and determines whether or not the amplitude signal exceeds the threshold value at an interval of a predetermined time period, selects a discrete value to be output by which based on the determination result, and outputs a signal having the selected discrete value.

The predetermined time period is shorter than a time period by which an average output power of the transmission circuit is controlled.

Preferably, the signal processing section includes a determination and quantization section for holding at least one threshold value and at least two discrete values corresponding to the threshold value, determining whether or not the amplitude signal exceeds the threshold value at an interval of the predetermined time period, selecting a discrete value to be output based on the determination result, and outputting a signal having the selected discrete value.

The signal generation section may further output power information which represents a magnitude of a transmission power of the transmission signal. In this case, the transmission circuit further comprises a multiplication section for multiplying the amplitude signal generated by the signal generation section and the power information on a stage post to the signal generation section. The series regulator controls a voltage to be supplied to the amplitude modulation section based on the magnitude of the amplitude signal which is input thereto via the multiplication section. The signal processing section determines whether or not the amplitude signal which is input thereto via the multiplication section exceeds the threshold value at an interval of a predetermined time period, selects a discrete value to be output based on the determination result, and outputs a signal having the selected discrete value.

Preferably, the signal processing section changes a length of the predetermined time period in accordance with a changing width of an envelope of the transmission signal. Specifically, when the changing width of the envelope of the transmission signal is small, the signal processing section shortens the predetermined time period; and when the changing width of the envelope of the transmission signal is large, the signal processing section extends the predetermined time period. Alternatively, the signal processing section may change a length of the predetermined time period in accordance with a modulation mode of the transmission signal.

The transmission circuit may further comprise a distortion compensation section, on an output side of the signal generation section, for compensating for at least one of the amplitude signal and the angle modulated signal so as to suppress a distortion occurring thereto in at least one of the switching regulator, the series regulator and the amplitude modulation section.

The present invention is also directed to a communication device comprising the above-described transmission circuit. The communication device comprises a transmission circuit for generating a transmission signal; and an antenna for outputting the transmission signal generated by the transmission circuit. The communication device may further comprise a receiving circuit for processing a receiving signal received from the antenna; and an antenna duplexer section for outputting the transmission signal generated by the transmission circuit to the antenna, and outputting the receiving signal received from the antenna to the receiving circuit.

As described above, according to the present invention, when the envelope of the modulated signal which is input to the amplification section is large, the non-linearity of the amplification section can be alleviated by raising the collector voltage or the drain voltage to be supplied to the amplification section. Since the collector voltage is raised only during a necessary time period, a high efficiency can be realized. When the envelope of the modulated signal which is input to the amplification section is small, the non-linearity of the amplification section can be alleviated by keeping the collector voltage at a constant level. Therefore, the signal amplified by the amplification section has a low distortion regardless of the magnitude of the envelope of the modulated signal. As described above, the transmission circuit can operate at a high efficiency and a low distortion by controlling the voltage to be supplied to the amplification section to an optimum level.

According to a transmission circuit of the present invention, the gain of the variable gain amplification section is changed so as to amplify the modulated signal based on the power information, which represents the magnitude of the transmission power required for communication with the base station, and also the magnitude of the signal to be output from the signal processing section is controlled so as to adjust the voltage supplied from the regulator to the amplification section to an optimum level. Thus, the transmission circuit can operate at a higher efficiency and a lower distortion.

A transmission circuit according to the present invention includes a distortion compensation section for compensating for the distortion generated in the amplification section, and thus can operate at a lower distortion. The communication device can guarantee the linearity of the transmission signal in a wide power amplification range and also reduce the power consumption, by using the above-described transmission circuit.

According to a transmission circuit according to the present invention, when the amplitude signal which is output from the signal generation section is large, the non-linearity of the amplitude modulation section can be alleviated by raising the collector voltage or the drain voltage supplied from the regulator to the amplitude modulation section. Since the voltage to be supplied to the amplitude modulation section is raised only during a necessary time period, a high efficiency can be realized. When the amplitude signal is small, the non-linearity of the amplitude modulation section can be alleviated by keeping the voltage to be supplied thereto at a constant level. Therefore, the modulated signal which is output from the amplitude modulation section has a low distortion regardless of the magnitude of the amplitude signal. Thus, the transmission circuit can operate at a high efficiency and a low distortion by controlling the voltage to be supplied to the amplitude modulation section to an optimum level.

A transmission circuit according to the present invention changes the magnitude of the amplitude signal based on the power information, which represents the magnitude of the transmission power required for communication with the base station, and thus adjusts the voltage supplied from the regulator to the amplitude modulation section to an optimum level for the amplitude modulation section. Thus, the transmission circuit can operate at a higher efficiency and a lower distortion.

A transmission circuit according to the present invention includes a timing control section at a stage post to the signal processing section, and thus solves the problem of the instability of the start of the switching regulator and thus operates at a lower distortion.

A transmission circuit according to the present invention includes a distortion compensation section for compensating for a distortion occurring in the amplitude modulation section, and thus can operate at a lower distortion. The communication device can guarantee the linearity of the transmission signal in a wide power amplification range and also reduce the power consumption.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5A is a block diagram showing an exemplary structure of a series regulator 14a;

FIG. 6A is a block diagram showing an exemplary structure of an amplification section 15a;

FIG. 7 is a block diagram showing an exemplary structure of a modified transmission circuit 1a;

FIG. 8 is a block diagram showing an exemplary structure of a transmission circuit 2 according to a second embodiment of the present invention;

FIG. 9 is a block diagram showing an exemplary structure of a signal processing section 22a;

FIG. 10 shows signal processing performed by the signal processing section 22a;

FIG. 20B is a block diagram showing an exemplary structure of a signal generation section 41x;

FIG. 27 is a block diagram showing an exemplary structure of a transmission circuit 4b including a distortion compensation section 52;

FIG. 28 is a block diagram showing an exemplary structure of a communication device according to a seventh embodiment of the present invention;

FIG. 29 is a block diagram showing an exemplary structure of a conventional transmission circuit 900;

DESCRIPTION OF THE PREFERRED EMBODIMENTS

First Embodiment

Figure 1:
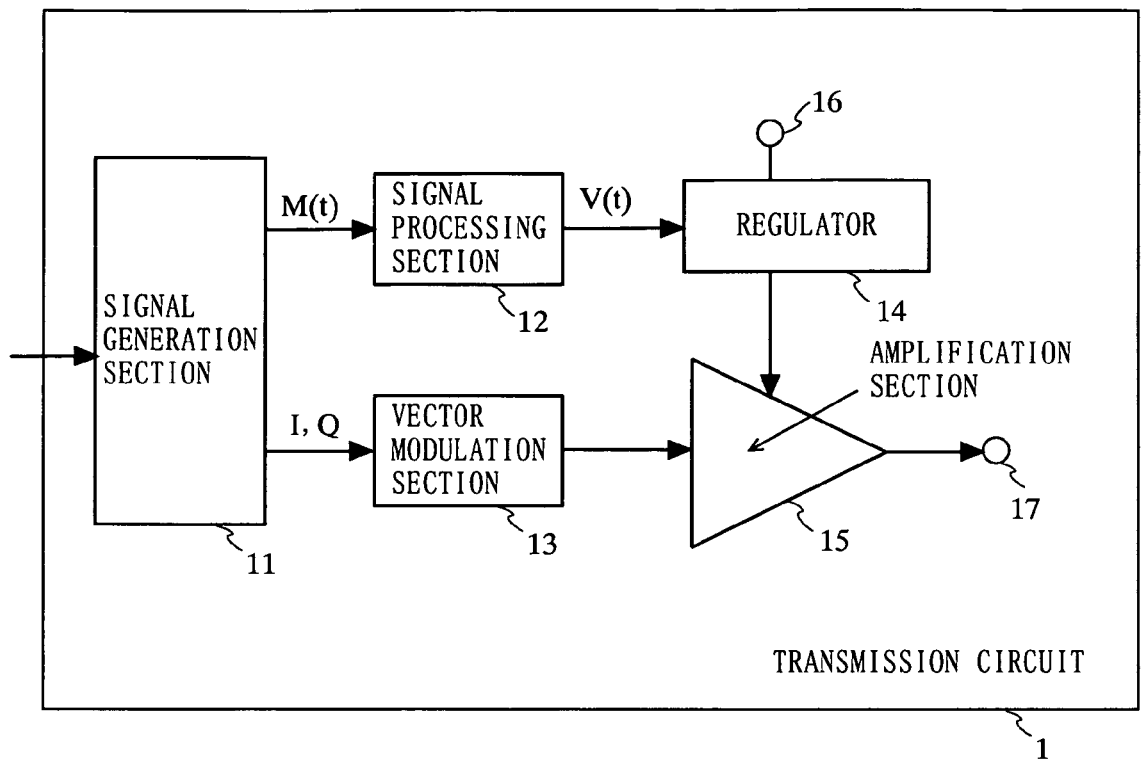
FIG. 1 is a block diagram showing an exemplary structure of a transmission circuit 1 according to a first embodiment of the present invention.

FIG. 1 is a block diagram showing an exemplary structure of a transmission circuit 1 according to a first embodiment of the present invention. As shown in FIG. 1, the transmission circuit 1 includes a signal generation section 11, a signal processing section 12, a vector modulation section 13, a regulator 14, an amplification section 15, a power supply terminal 16, and an output terminal 17. The signal generation section 11 performs predetermined signal processing on input data, and generates and outputs a vector signal including I and Q signals and an amplitude signal M(t) representing the magnitude of the vector signal (i.e., the magnitude of the I and Q signals). The amplitude signal M(t) is represented by $(I^2+Q^2)^{1/2}$. The vector signal is input to the vector modulation section 13. The vector modulation section 13 performs vector modulation on the vector signal and outputs the resultant signal as a modulated signal. As the vector modulation section 13, a quadrature modulator, for example, is used. The modulated signal which is output from the vector modulation section 13 is input to the amplification section 15.

The amplitude signal M(t) is input to the signal processing section 12. The signal processing section 12 performs signal processing on the amplitude signal M(t) and outputs the resultant signal. The regulator 14 is supplied with a DC voltage from the power supply terminal 16. The regulator 14 supplies a voltage, controlled in accordance with the magnitude of the signal processed by the signal processing section 12, to the amplification section 15. The regulator 14 typically supplies a voltage in proportion to the magnitude of the signal processed by the signal processing section 12 to the amplification section 15. The amplification section 15 amplifies the modulated signal which is output from the vector modulation section 13 in accordance with the voltage supplied from the regulator 14. The signal amplified by the amplification section 15 is output from the output terminal 17 as a transmission signal.

Figure 2:
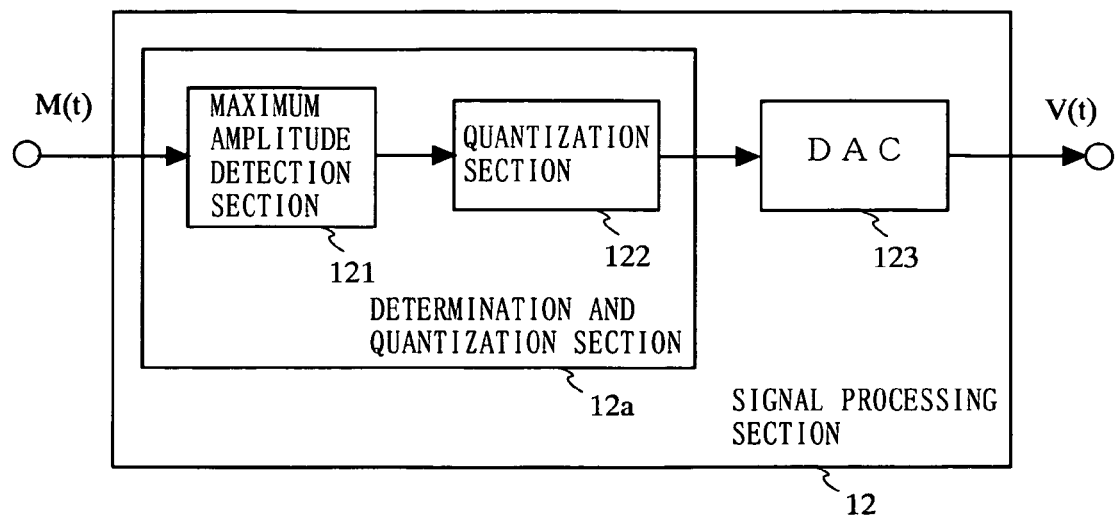
FIG. 2 is a block diagram showing a detailed structure of a signal processing section 12.

FIG. 2 is a block diagram showing an exemplary structure of the signal processing section 12. As shown in FIG. 2, the signal processing section 12 includes a determination and quantization section 12a and a D/A converter 123. The determination and quantization section 12a receives the amplitude signal M(t) from the signal generation section 11. The determination and quantization section 12a holds at least one threshold value and at least two discrete values corresponding to the threshold value. The determination and quantization section 12a determines whether or not the maximum value of the amplitude signal M(t) exceeds the threshold value at an interval of a predetermined time period, selects a discrete value to be output based on the determination result, and outputs a signal having the selected discrete value.

In the above, the determination and quantization section 12a is described as determining whether or not the maximum value of the amplitude signal M(t) exceeds the threshold value at an interval of the predetermined time period. It is not absolutely necessary, however, to determine whether or not the maximum value of the amplitude signal M(t) exceeds the threshold value. The determination and quantization section 12a may determine whether or not one of values included in the amplitude signal M (t) exceeds the threshold value at an interval of the predetermined time period, select a discrete value to be output based on the determination result, and output a signal having the selected discrete value.

Figure 3A:
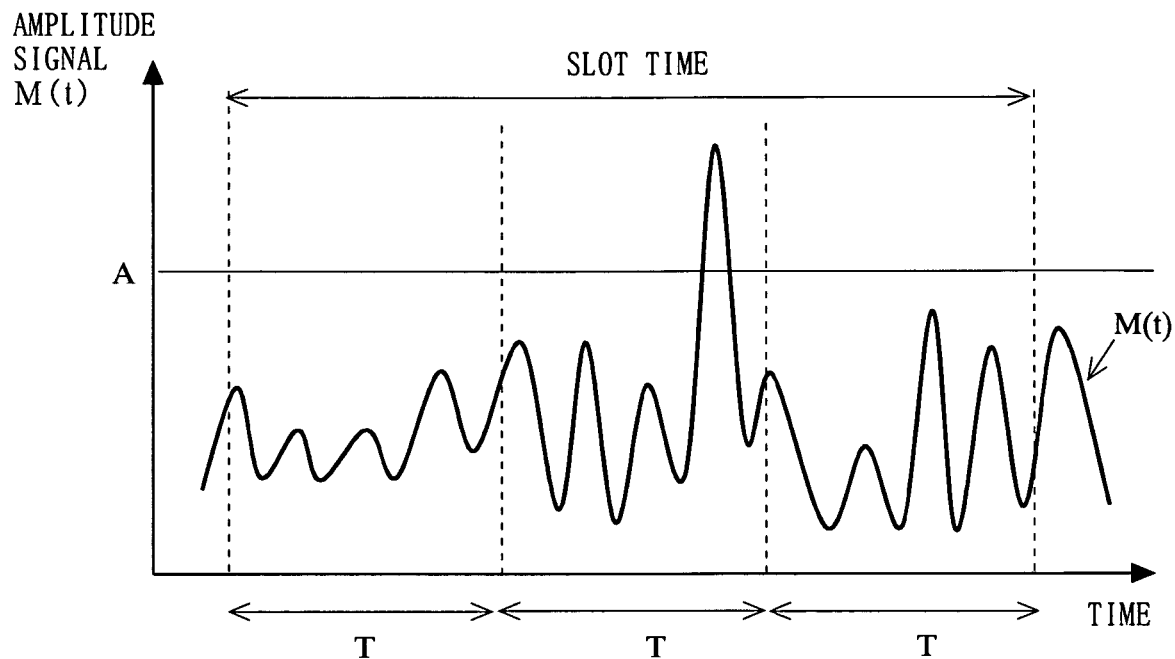
FIG. 3A shows an exemplary waveform of an amplitude signal M(t) which is input to a maximum amplitude detection section 121.

For example, the determination and quantization section 12a may include a maximum amplitude detection section 121 and a quantization section 122. In such a case, the maximum amplitude detection section 121 receives the amplitude signal M (t) from the signal generation section 11. The maximum amplitude detection section 121 detects the maximum value of the amplitude signal M (t) at an interval of a predetermined detection time period T. FIG. 3A shows an exemplary waveform of the amplitude signal M(t) which is input to the maximum amplitude detection section 121. Referring to FIG. 3A, the detection time T is set to be longer than a time period in which the waveform of the amplitude signal M(t) changes (i.e., a symbol time) but to be shorter than a time period by which the average output power from the transmission circuit 1 is controlled (herein after, this time period will be referred to as a "slot time"). For example, where the detection time T is 16 times the symbol time and the sampling time is 8 times the symbol time, 1024 sampling points exist in the detection time T. The maximum amplitude detection section 121 detects the maximum value of the sampling points in each detection time T.

Figure 3B:
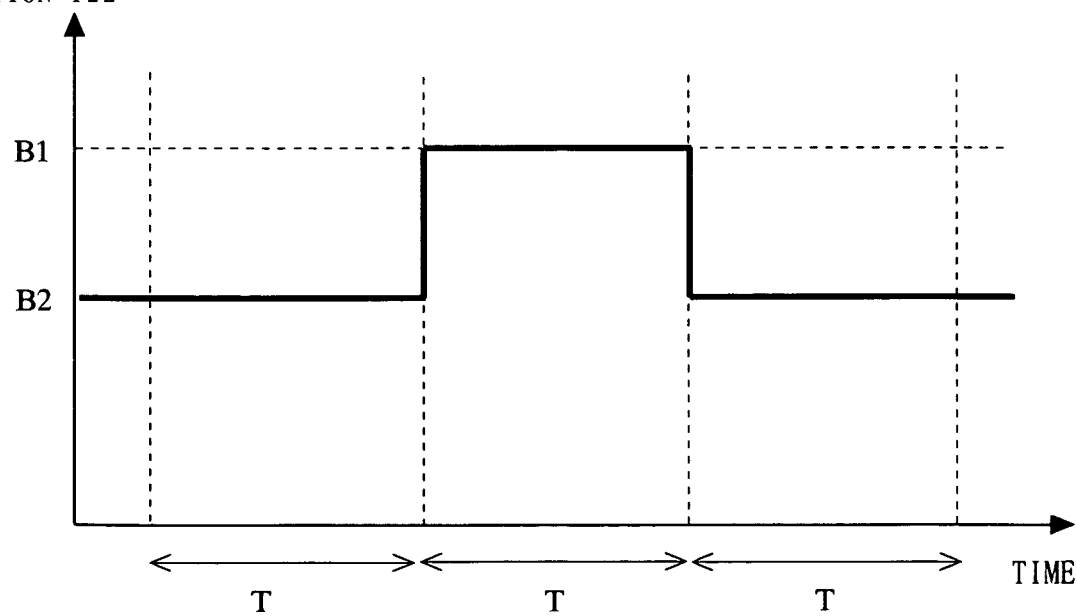
FIG. 3B shows an exemplary waveform of a signal which is output from a quantization section 122.

The quantization section 122 holds at least one threshold value and at least two discrete values corresponding to the threshold value. The quantization section 122 determines whether or not the maximum value of the sampling points exceeds the threshold value, and selects a discrete value to be output based on the determination result. Thus, the quantization section 122 converts the amplitude signal M(t) into a signal made discrete by at least two discrete values and outputs the resultant signal. FIG. 3B shows an exemplary waveform of a signal which is output from the quantization section 122. As shown in FIG. 3B, the quantization section 122 outputs a discrete value B1 when the maximum value of the sampling points exceeds the threshold value A, and outputs a discrete value B2 otherwise. Here, B1>B2. The signal which is output by the quantization section 122 is converted into an analog signal by the D/A converter 123 and output as a discrete value V(t).

In the above, the quantization section 122 sets one threshold value A and outputs two discrete values B1 and B2. Alternatively, the quantization section 122 may set two threshold values and output three discrete values, or set a greater number of threshold values and output a corresponding number of discrete values.

The signal processing section 12 may not necessarily include the D/A converter 123. When the D/A converter 123 is not included, the signal processing section 12 outputs a digital signal which is output from the determination and quantization section 12a with no conversion, and controls the regulator 14 with the digital signal.

Figure 4:
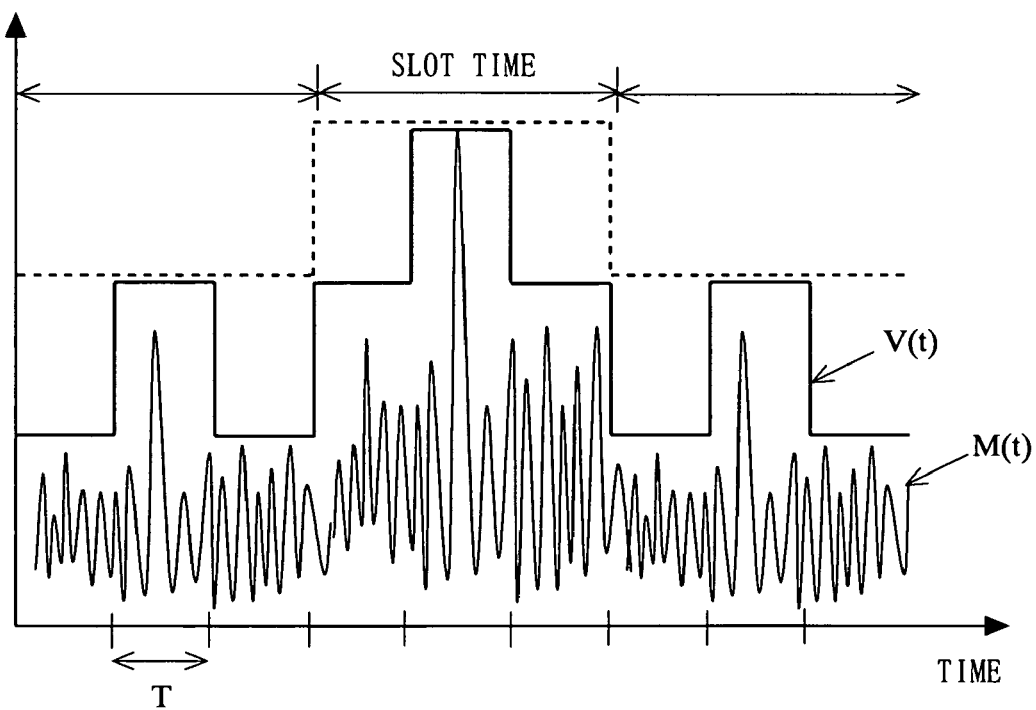
FIG. 4 shows the relationship between the amplitude signal M(t) and the discrete value V(t)

FIG. 4 shows the relationship between the amplitude signal M(t) and the discrete value V(t). As shown in FIG. 4, the signal processing section 12 performs the above-described signal processing on the amplitude signal M(t), and outputs the discrete value V(t) controlled in accordance with the magnitude of the amplitude signal M(t) at an interval of the detection time period T. The dashed line represents a discrete value which is output when the slot time is used instead of the detection time T.

As shown in FIG. 4, the signal processing section 12 can output the discrete value V(t) controlled in accordance with the magnitude of the amplitude signal M(t) at an interval of a time period shorter than the slot time, by setting the detection time period T to be shorter than the slot time. Therefore, the transmission circuit 1 can control the power of the transmission signal at an interval of the time period shorter than the slot time. In this manner, the power consumption is reduced than in the case where the power of the transmission signal is controlled by each slot time.

Here, a method for determining the detection time T for the transmission circuit 1 according to the first embodiment will be described in more detail. As described above, the detection time T is set to be longer than the symbol time of the waveform of the amplitude signal M(t) but to be shorter than the slot time. In the case of the W-CDMA system, the symbol time is set to 0.26 μs (1/3.84 MHz), and the slot time is set to 666 μs.

When the detection time T is set to be relatively long within the range of longer than the symbol time of the waveform of the amplitude signal M(t) but to be shorter than the slot time, the regulator 14 is not required to operate at a very high speed. Therefore, the transmission circuit 1 obtains an advantage that the efficiency of the regulator 14 is increased. However, when the detection time T is set to be relatively long, a region in which the output voltage of the regulator 14 is kept high is broadened although the magnitude of the amplitude signal M(t) is small. As a result, the loss of the transmission circuit 1 is increased.

When the detection time T is set to be relatively short within the range of longer than the symbol time of the waveform of the amplitude signal M(t) but to be shorter than the slot time, the output voltage of the regulator 14 is controlled at an interval of a shorter time period in accordance with the magnitude F of the amplitude signal M(t). Therefore, the loss of the transmission circuit 1 is decreased. However, when the detection time T is set to be shorter, the regulator 14 is required to operate at a higher speed. As a result, the efficiency of the regulator 14 is decreased. Under the circumstances, the detection time T is set such that the transmission circuit 1 operates best in consideration of these contradicting conditions.

Figure 5A:
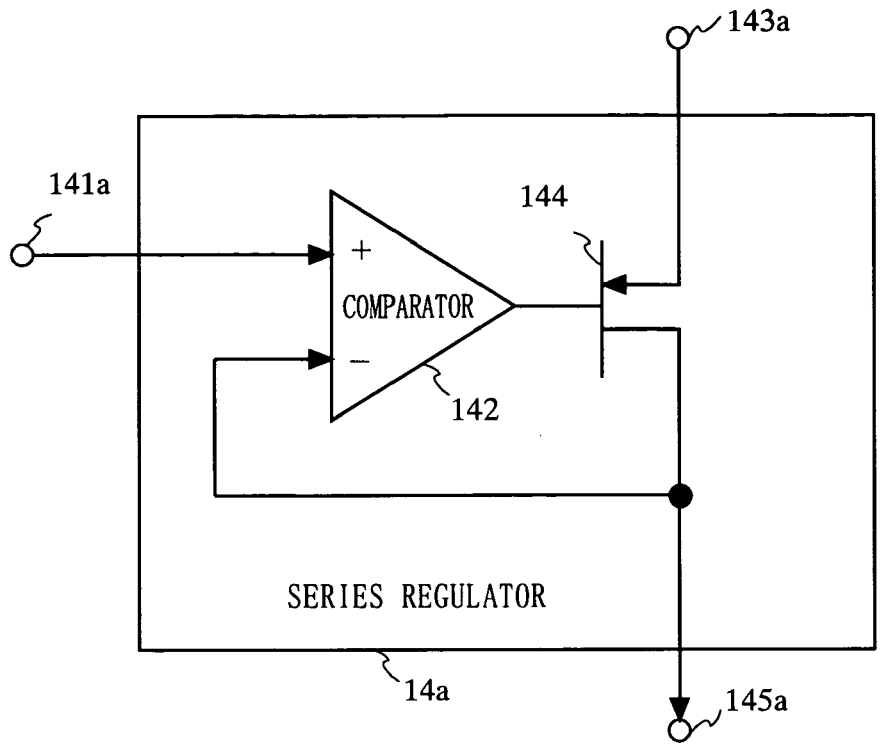

Next, the regulator 14 will be described in detail. As the regulator 14, a series regulator or a switching regulator is used such that the regulator 14 stably supplies a voltage to the amplification section 15. FIG. 5A is a block diagram showing an exemplary structure of a series regulator 14a. As shown in FIG. 5A, the series regulator 14a includes an input terminal 141a, a comparator 142, a power supply terminal 143a, a transistor 144, and an output terminal 145a. In this example, the transistor 144 is a field effect transistor. The input terminal 141a receives a discrete value V(t) from the signal processing section 12. The discrete value V(t) is input to a gate terminal of the transistor 144 via the comparator 142. A drain terminal of the transistor 144 is supplied with a DC voltage from the power supply terminal 143a.

The transistor 144 outputs a voltage in proportion to the magnitude of the input discrete value V(t) from a source terminal thereof. The voltage which is output from the source terminal of the transistor 144 is fed back to the comparator 142. Based on the fed-back voltage, the comparator 142 adjusts the magnitude of the discrete value V(t) to be input to the gate terminal of the transistor 144. In this way, the series regulator 14a can stably supply a voltage controlled in accordance with the magnitude of the discrete value V(t) from the output terminal 145a. The transistor 144 may be a bipolar transistor, in which case substantially the same effect is provided.

Figure 5B:
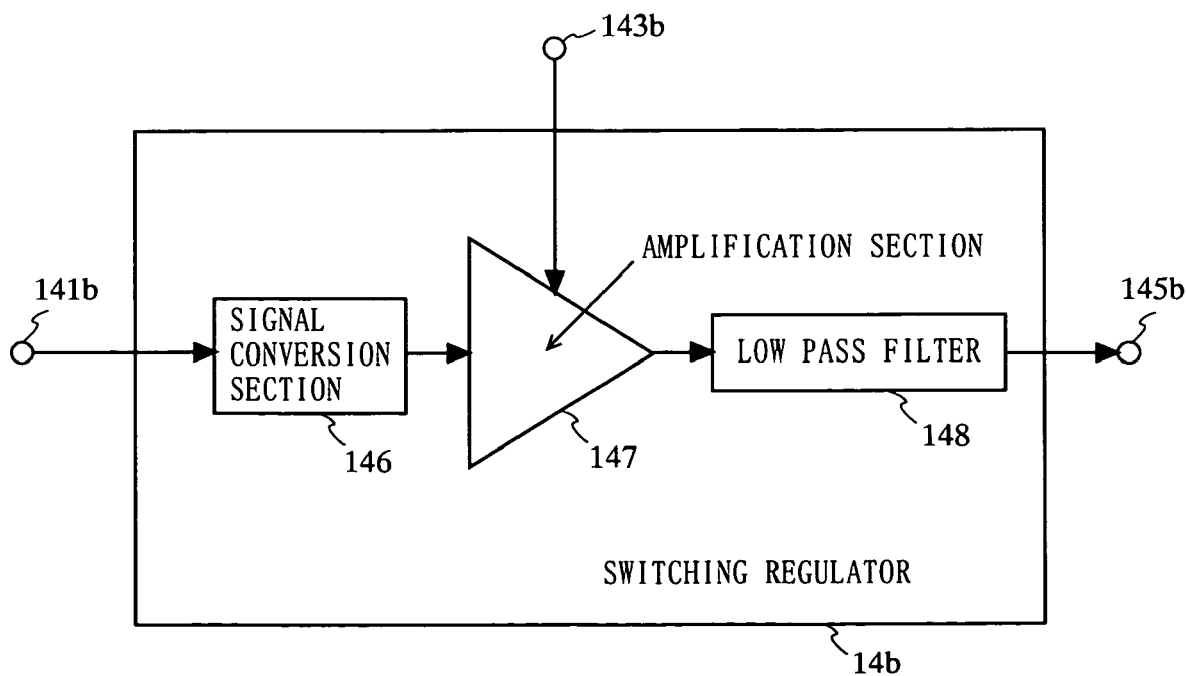
FIG. 5B is a block diagram showing an exemplary structure of a switching regulator 14b.

FIG. 5B is a block diagram showing an exemplary structure of a switching regulator 14b. As shown in FIG. 5B, the switching regulator 14b includes an input terminal 141b, a signal conversion section 146, a power supply terminal 143b, an amplifier 147, a low pass filter 148, and an output terminal 145b. The input terminal 141 receives a discrete value V(t) from the signal processing section 12. The discrete value V(t) is input to the signal conversion section 146. The signal conversion section 146 converts the input discrete value V(t) into a signal processed by PWM or delta-sigma modulation. The signal converted by the signal conversion section 146 is input to the amplifier 147. The amplifier 147 amplifies the input signal and outputs the resultant signal. The amplifier 147 is supplied with a DC voltage from the power supply terminal 143b. As the amplifier 147, a high efficiency switching amplifier such as a class D amplifier or the like is used.

The signal which is output from the amplifier 147 is input to the low pass filter 148. The low pass filter 148 removes a spurious component such as, for example, quantization noise or switching noise from the signal which is output from the amplifier 147. The signal deprived of the spurious component by the low pass filter 148 is output from the output terminal 145b as a voltage controlled in accordance with the magnitude of the discrete value V(t). The switching regulator 14b may feed the signal which is output from the low pass filter 148 back to the signal conversion section 146 in order to stabilize the voltage to be output.

Figure 5C:
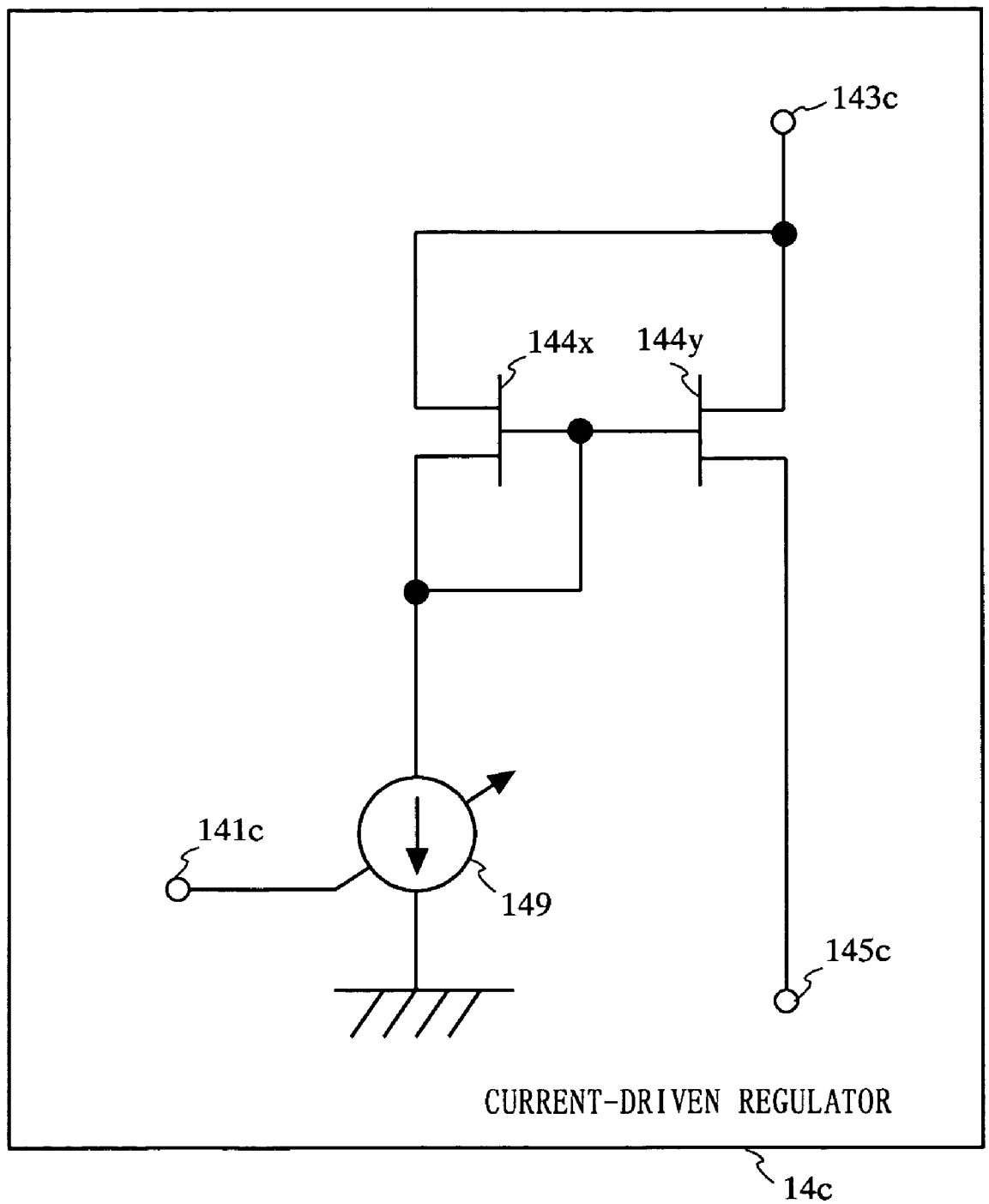
FIG. 5C is a block diagram showing an exemplary structure of a current-driven regulator 14c.

As the regulator 14, a current-driven regulator may be used. FIG. 5C is a block diagram showing an exemplary structure of a current-driven regulator 14c. As shown in FIG. 5C, the current-driven regulator 14c includes an input terminal 141c, a power supply terminal 143c, a variable current source 149, a transistor 144x, a transistor 144y, and an output terminal 145c. The input terminal 141c receives a discrete value V(t) via the signal processing section 12. The power supply terminal 143c is supplied with a DC voltage. The discrete value V(t) which is input from the input terminal 141c is output from the output terminal 145c via the variable current source 149, the transistor 144x and the transistor 144y as a current controlled in accordance with the magnitude of the discrete value V(t). The current-driven regulator 14c having such a structure is useful when the amplification section 15 includes a bipolar transistor. The transistor 144x and the transistor 144y may each be a field effect transistor or a bipolar transistor. In either case, substantially the same effect is provided.

FIG. 6A is a block diagram showing an exemplary structure of the amplification section 15a. As shown in FIG. 6A, the amplification section 15a includes an input terminal 151, a matching circuit 152, a bias circuit 153, a power supply terminal 154, a power supply terminal 155, a bias circuit 156, a transistor 157, a matching circuit 158, and an output terminal 159. In this example, the transistor 157 is a bipolar transistor. The input terminal 151 receives a modulated signal from the vector modulation section 13. The modulated signal is input to a base terminal of the transistor 157 via the matching circuit 152.

The power supply terminal 154 is supplied with a DC voltage. Namely, the base terminal of the transistor 157 is supplied with a bias voltage via the power supply terminal 154 and the bias circuit 153. The power supply terminal 155 is supplied with a voltage controlled in accordance with the magnitude of the discrete value V(t) from the regulator 14. The voltage controlled in accordance with the magnitude of the discrete value V(t) is supplied to a collector terminal of the transistor 157 via the bias circuit 156. The transistor 157 amplifies the modulated signal with the voltage controlled in accordance with the magnitude of the discrete value V(t), and outputs the resultant signal.

The modulated signal which is output from the transistor 157 is output from the output terminal 159 via the matching circuit 158 as a transmission signal. The transistor 157 may be a field effect transistor, in which case substantially the same effect is provided. In the amplification section 15a, the voltages which are input to the power supply terminal 154 and the power supply terminal 155 may be exchanged with each other. In this case also, substantially the same effect is provided. Where the regulator 14 is the current-driven regulator 14c, the power supply terminal 155 receives a current controlled in accordance with the magnitude of the discrete value V(t) from the current-driven regulator 14c.

Figure 6B:
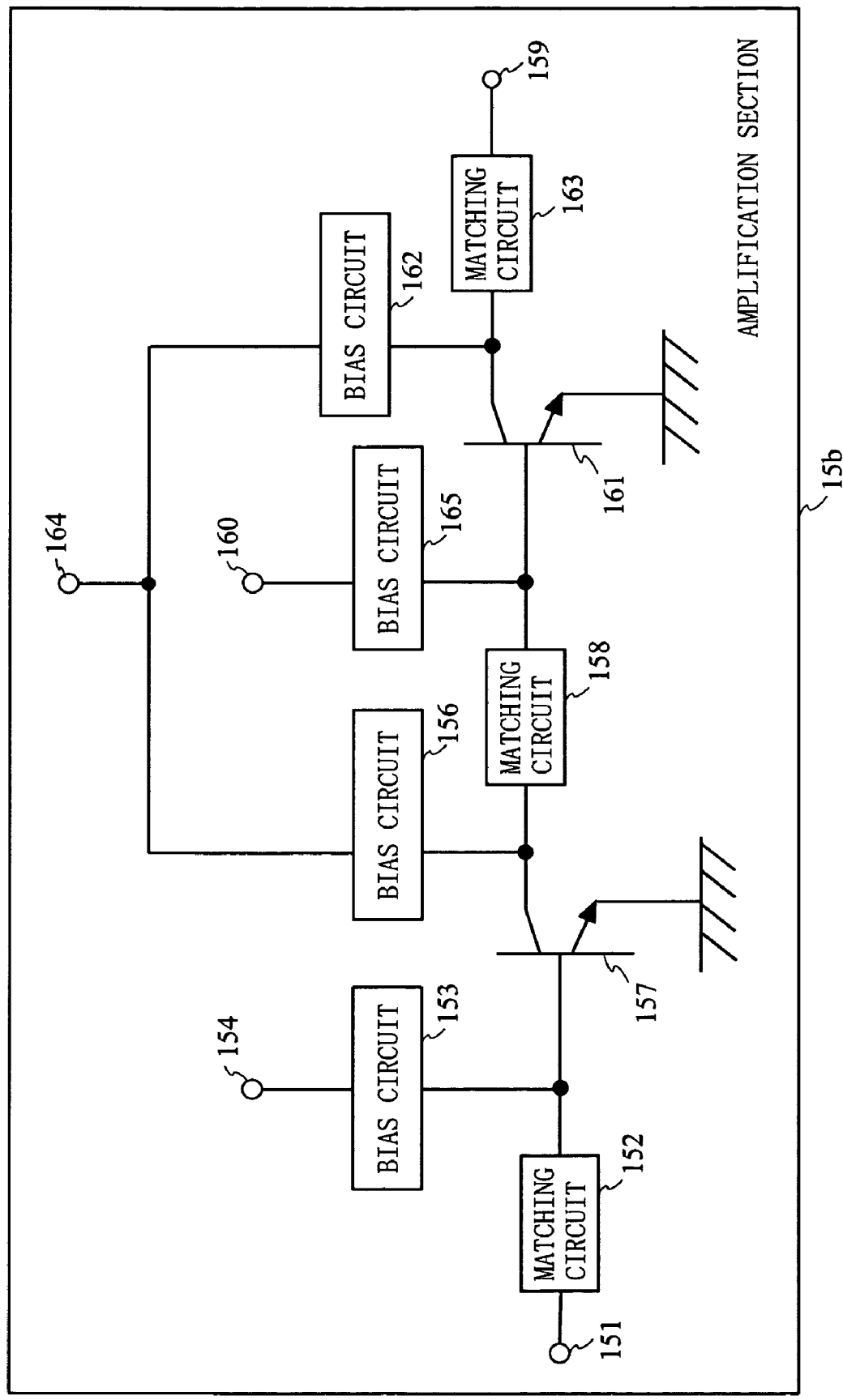
FIG. 6B is a block diagram showing an exemplary structure of an amplification section 15b.

The amplification section 15 may have a different structure from that of the amplification section 15a. FIG. 6B is a block diagram showing an exemplary structure of an amplification section 15b. The amplification section 15b shown in FIG. 6B has a structure obtained basically by connecting two amplification sections 15a described above in series. In this example, the transistor 157 and the transistor 161 are bipolar transistors. A base terminal of the transistor 157 is supplied with a bias voltage from the power supply terminal 154 via the bias circuit 153. A base terminal of the transistor 161 is supplied with a bias voltage from the power supply terminal 160 via the bias circuit 165.

A collector terminal of the transistor 157 is supplied with a voltage controlled in accordance with the magnitude of the discrete value V(t) from the regulator 14 via the power supply terminal 164 and the bias circuit 156. A collector terminal of the transistor 161 is supplied with a voltage controlled in accordance with the magnitude of the discrete value V(t) from the regulator 14 via the power supply terminal 164 and the bias circuit 162. Owing to such a structure, the amplification section 15b can output a modulated signal having a wider dynamic range than the amplification section 15a shown in FIG. 6A. The transistor 157 and the transistor 161 may be field effect transistors, in which case substantially the same effect is provided. Where the regulator 14 is the current-driven regulator 14c, the power supply terminal 155 and the power supply terminal 164 receive a current controlled in accordance with the magnitude of the discrete value V(t) from the current-driven regulator 14c.

Figure 7:
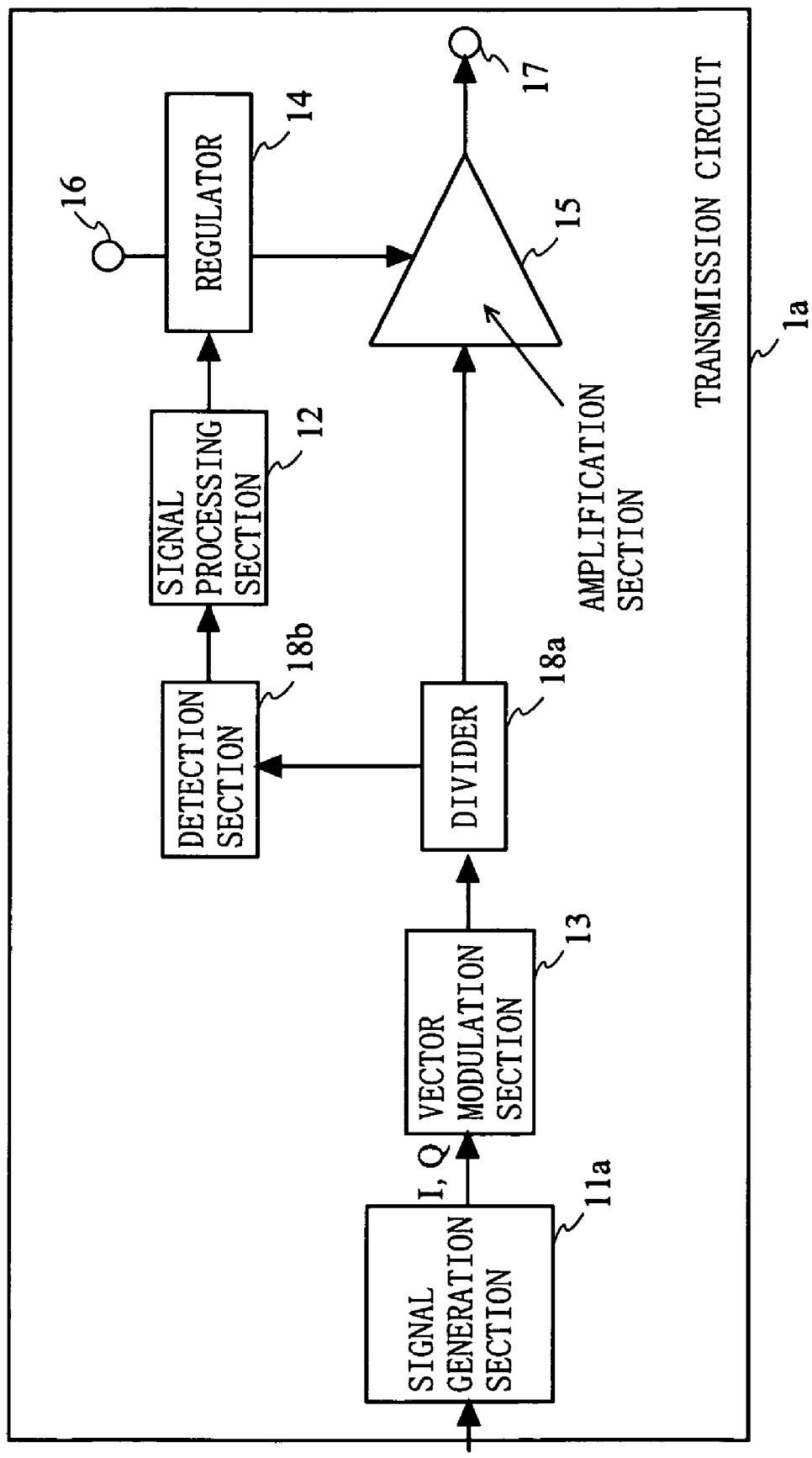

A transmission circuit modified from the above-described structure (the structure in FIG. 1) may be obtained. FIG. 7 is a block diagram showing an exemplary structure of a modified transmission circuit 1a. As shown in FIG. 7, the transmission circuit 1a includes a signal generation section 11a, a vector modulation section 13, a divider 18a, a detection section 18b, a signal processing section 12, a regulator 14, an amplification section 15, a power supply terminal 16, and an output terminal 17. The signal generation section 11a generates and outputs I and Q signals. The divider 18a outputs a modulated signal obtained by vector modulation by the vector modulation section 13 to the amplification section 15 and the detection section 18b. The detection section 18b detects an envelope of the modulated signal and outputs the detected signal (i.e., an amplitude component of the modulated signal) to the signal processing section 12. The subsequent operation (i.e., the operation of the signal processing section 12, the regulator 14 and the amplification section 15) is the same as described above.

As described above, with the transmission circuit 1 according to the first embodiment of the present invention, when the envelope of the modulated signal which is input to the amplification section 15 is large, the non-linearity of the amplification section 15 can be alleviated by raising the collector voltage or drain voltage to be supplied to the amplification section 15. Since the voltage to be supplied to the amplification section 15 is raised only during a necessary time period, a high efficiency can be realized. When the envelope of the modulated signal which is input to the amplification section 15 is small, the non-linearity of the amplification section 15 can be alleviated by keeping the voltage to be supplied thereto at a constant level. Therefore, the signal amplified by the amplification section 15 has a low distortion regardless of the magnitude of the envelope of the modulated signal. Thus, the transmission circuit 1 can operate at a high efficiency and a low distortion by controlling the voltage to be supplied to the amplification section 15 to an optimum level.

Second Embodiment

FIG. 8 is a block diagram showing an exemplary structure of a transmission circuit 2 according to a second embodiment of the present invention. As shown in FIG. 8, the transmission circuit 2 includes a signal generation section 21, a signal processing section 22, a vector modulation section 13, a variable gain amplification section 28, a regulator 14, an amplification section 15, a power supply terminal 16, and an output terminal 17. In the second embodiment, elements identical to those of the first embodiment bear the identical reference numerals thereto, and detailed descriptions thereof will be omitted.

The signal generation section 21 outputs I and Q signals as a vector signal, an amplitude signal M(t), and power information P representing the magnitude of the transmission power required for communication with a base station. The I and Q signals are input to the vector modulation section 13. The vector modulation section 13 performs vector modulation on the I and Q signals and outputs the resultant signal as a modulated signal. The modulated signal which is output from the vector modulation section 13 is input to the variable gain amplification section 28. The variable gain amplification section 28 amplifies the modulated signal using a predetermined gain. The modulated signal amplified by the variable gain amplification section 28 is input to the amplification section 15.

The amplitude signal M(t) is input to the signal processing section 22. After being processed as predetermined by the signal processing section 22, the amplitude signal M(t) is input to the regulator 14. The regulator 14 is supplied with a DC voltage from the power supply terminal 16. The regulator 14 supplies a voltage in accordance with the magnitude of the signal processed by the signal processing section 22 to the amplification section 15. The regulator 14 typically supplies a voltage in proportion to the magnitude of the signal processed by the signal processing section 22 to the amplification section 15. The voltage which is output from the regulator 14 is supplied to the amplification section 15. The signal amplified by the amplification section 15 is output from the output terminal 17.

The power information P which is output from the signal generation section 21 is input to the signal processing section 22 and the variable gain amplification section 28. The variable gain amplification section 28 amplifies the modulated signal using a gain in accordance with the input power information P. For example, the variable gain amplification section 28 increases the gain by 1 dB when the magnitude of the power to be output from the transmission circuit 2 is increased by 1 dB. The modulated signal which is output from the variable gain amplification section 28 is expressed as $G(I \cdot \cos \omega t - Q \cdot \sin \omega t)$. G is a parameter controlled in accordance with the power information P. Namely, even when the magnitude of the amplitude signal M(t) is the same, the magnitude of the modulated signal which is input to the magnification section 15 is different when the parameter G is different. Therefore, the signal processing section 22 needs to control the magnitude of the discrete value V(t) to be output in accordance with the power information P, so as to adjust the voltage supplied from the regulator 14 to the amplification section 15 to an optimum level.

Figure 9:
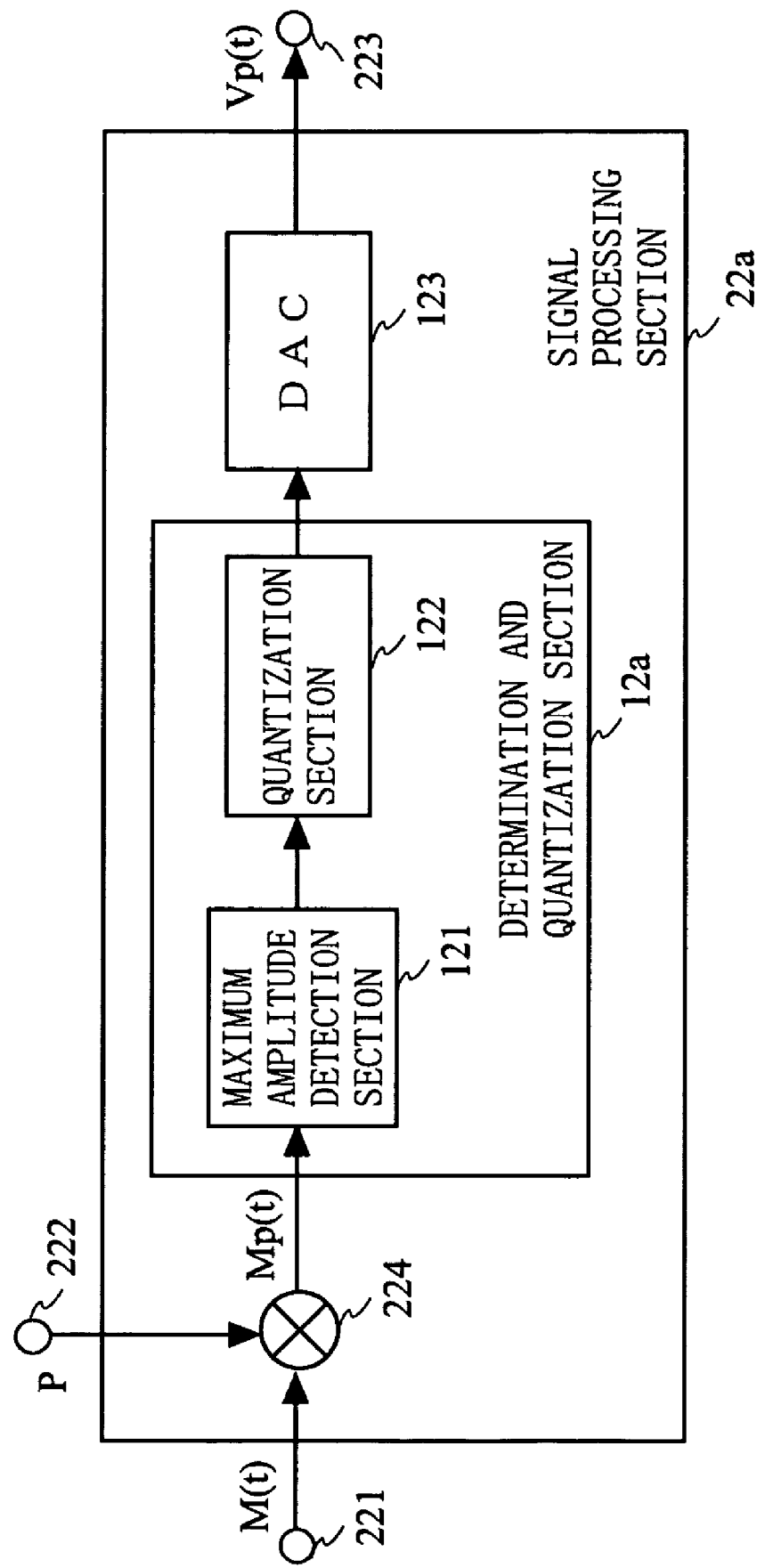

The signal processing section 22 may be, for example, a signal processing section 22a described below. FIG. 9 is a block diagram showing an exemplary structure of the signal processing section 22a. As shown in FIG. 9, the signal processing section 22a includes an input terminal 221, an input terminal 222, an output terminal 223, a multiplication section 224, a determination and quantization section 12a and a D/A converter 123. The determination and quantization section 12a includes a maximum amplitude detection section 121 and a quantization section 122 as described in the first embodiment. The signal processing section 22a may not necessarily include the D/A converter 123. When the D/A converter 123 is not included, the signal processing section 22a outputs a digital signal which is output from the determination and quantization section 12a with no conversion, and controls the regulator 14 with the digital signal.

Figure 10:
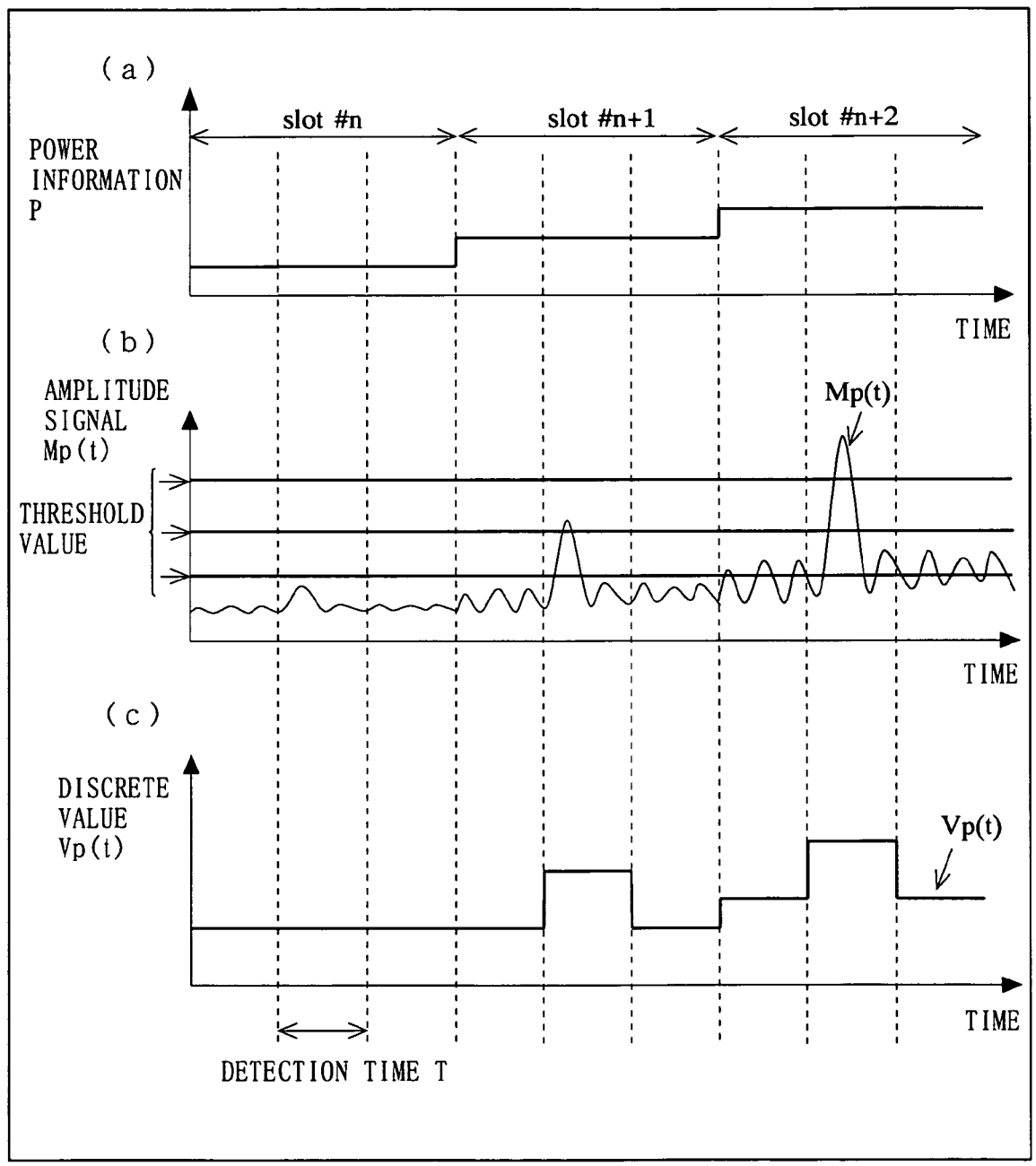

Hereinafter, with reference to FIG. 10 (parts (a) through (c)), signal processing performed by the signal processing section 22a will be described. FIG. 10, part (a) shows an exemplary waveform of the power information P which is output from the signal generation section 21. FIG. 10, part (b) shows an exemplary waveform of an amplitude signal Mp(t) which is output from the multiplication section 224. FIG. 10, part (c) shows an exemplary waveform of a discrete value Vp(t) which is output from the signal processing section 22a.

The multiplication section 224 receives the power information P (see FIG. 10, part (a)) via the input terminal 222 and also receives the amplitude signal M(t) via the input terminal 221. The multiplication section 224 multiplies the amplitude signal M (t) and the power information P, and outputs the amplitude signal Mp(t) (see FIG. 10, part (b)) having a magnitude controlled in accordance with the power information P. The amplitude signal Mp(t) which is output from the multiplication section 224 is input to the determination and quantization section 12a.

In the determination and quantization section 12a, the maximum amplitude detection section 121 performs substantially the same processing as that in the first embodiment, i.e., detects the maximum value of the amplitude signal Mp(t) at an interval of a predetermined detection time period T. The quantization section 122 holds at least one threshold value and at least two discrete values corresponding to the threshold value. Referring to FIG. 10, part (c), the quantization section 122 performs substantially the same processing as that in the first embodiment, i.e., determines whether or not the maximum value of the amplitude signal Mp(t) exceeds a predetermined threshold value and selects a discrete value to be output based on the determination result. The signal which is output from the quantization section 122 is converted into an analog signal by the D/A converter 123 and output as the discrete value Vp(t).

In this way, the signal processing section 22a controls the magnitude of the discrete value Vp(t) to be output in accordance with the power information P, and thus adjusts the voltage supplied from the regulator 14 to the amplification section 15 to an optimum level. In this example, the signal processing section 22a holds three threshold values and four discrete values. The multiplication section 224 may not necessarily be included in the signal processing section 22. When the multiplication section 224 is not included in the signal processing section 22, the transmission circuit 2 may include the multiplication section 224 between the signal generation section 21 and the signal processing section 22.

Figure 11:
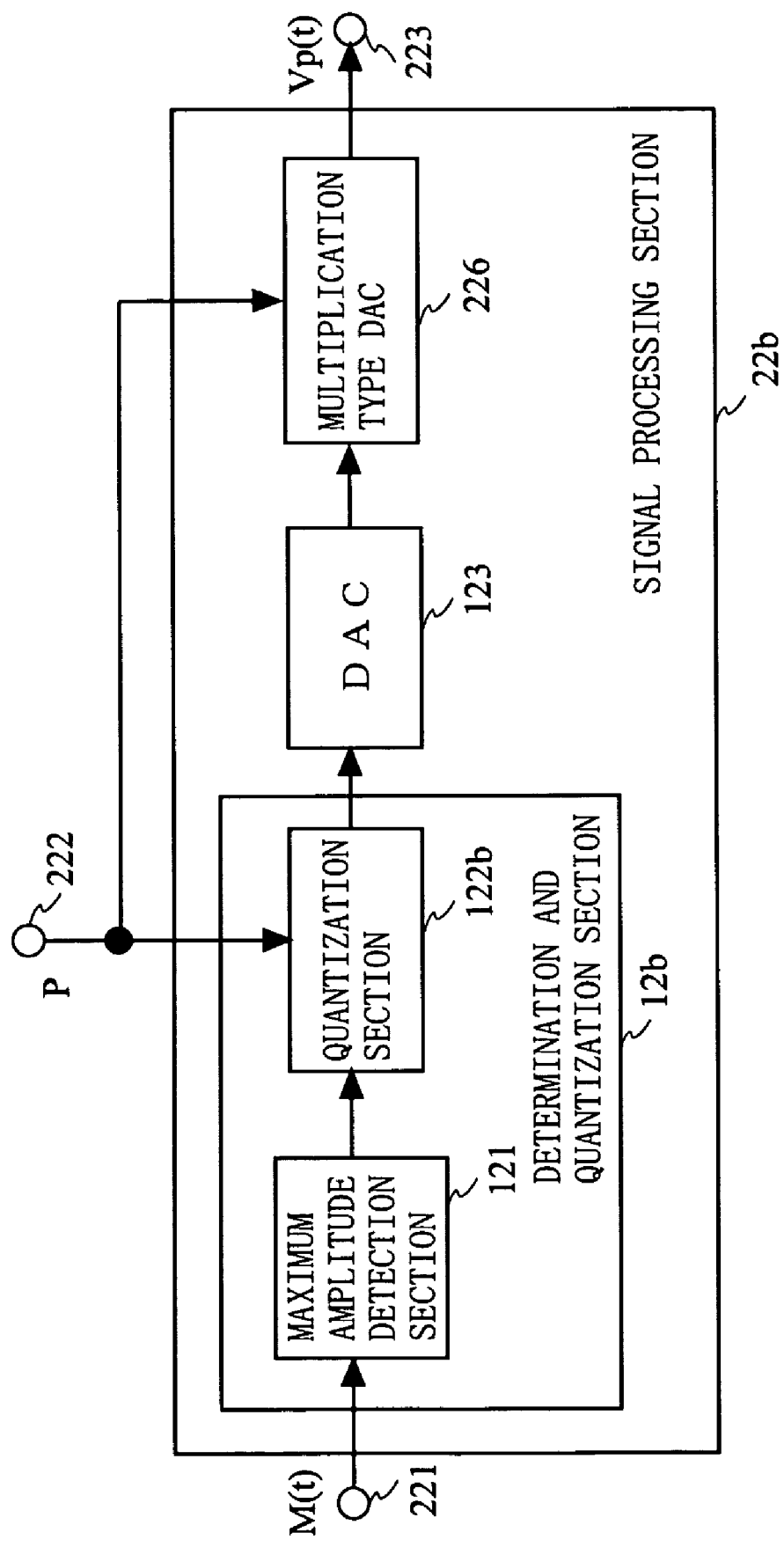
FIG. 11 is a block diagram showing an exemplary structure of a signal processing section 22b.

The signal processing section 22 may be, for example, a signal processing section 22b described below. FIG. 11 is a block diagram showing an exemplary structure of the signal processing section 22b. As shown in FIG. 11, the signal processing section 22b includes an input terminal 221, an input terminal 222, an output terminal 223, a determination and quantization section 12b a D/A converter 123, and a multiplication type D/A converter 226. The determination and quantization section 12b includes a maximum amplitude detection section 121 and a quantization section 122b.

Figure 12:
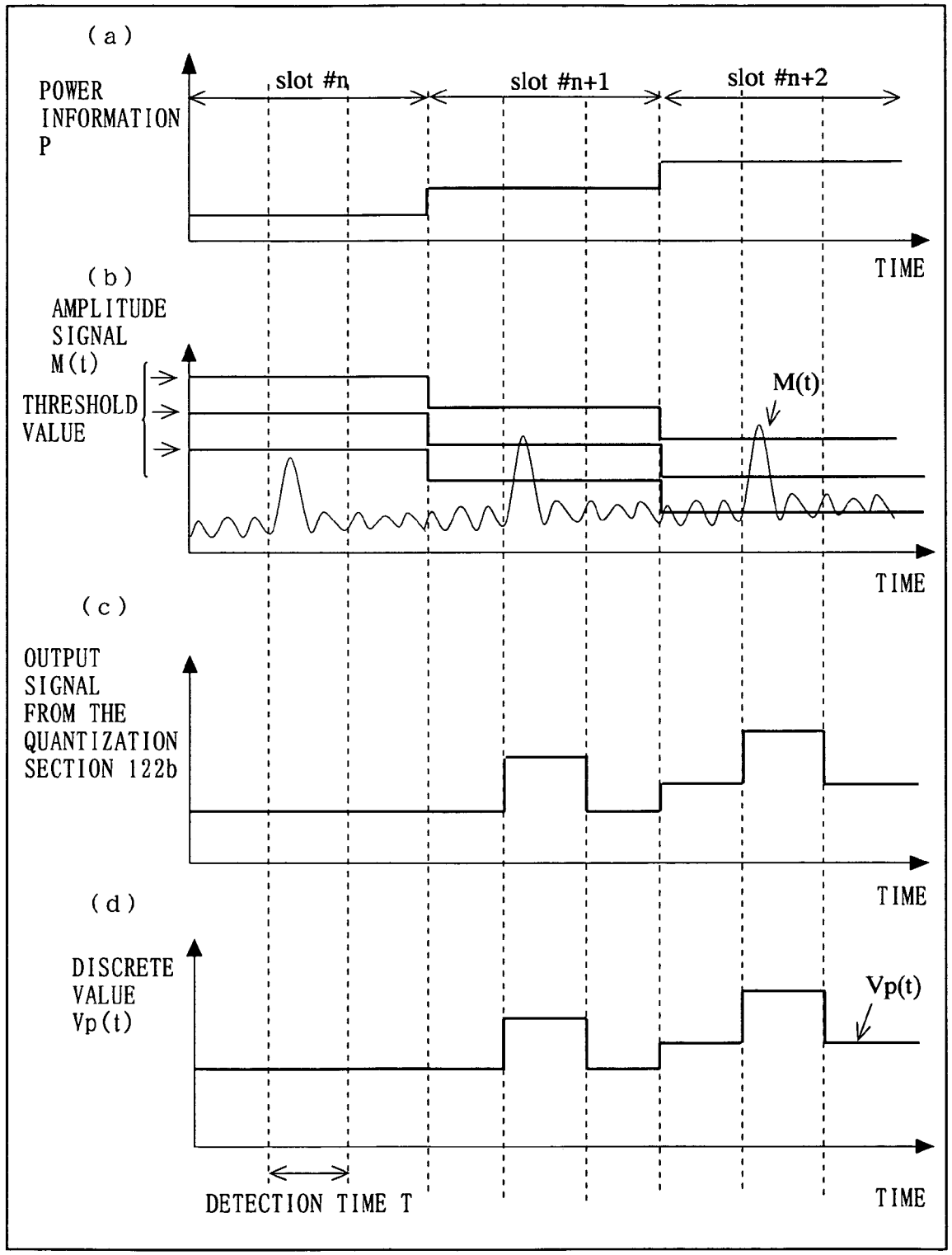
FIG. 12 shows signal processing performed by the signal processing section 22b.

Hereinafter, with reference to FIG. 12 (parts (a) through (d)), signal processing performed by the signal processing section 22b will be described. FIG. 12, part (a) shows an exemplary waveform of the power information P which is output from the signal generation section 21. FIG. 12, part (b) shows an exemplary waveform of an amplitude signal M(t) which is input to the determination and quantization section 12b. FIG. 12, part (c) shows an exemplary waveform of an output signal from the quantization section 122b. FIG. 12, part (d) shows an exemplary waveform of an output signal from the multiplication type D/A converter 226.

The determination and quantization section 12*b* receives the power information P (see FIG. 12, part (a)) via the input terminal 222 and also receives the amplitude signal M(t) (see FIG. 12, part (b)) via the input terminal 221. In the determination and quantization section 12*b*, the maximum amplitude detection section 121 performs substantially the same processing as that in the first embodiment, i.e., detects the maximum value of the amplitude signal M(t) at an interval of the predetermined detection time period T. The quantization section 122*b* holds at least one threshold value and at least two discrete values corresponding to the threshold value. The quantization section 122*b* changes the levels of the threshold value and the discrete values in accordance with the magnitude of the input power information P.

Figure 13:
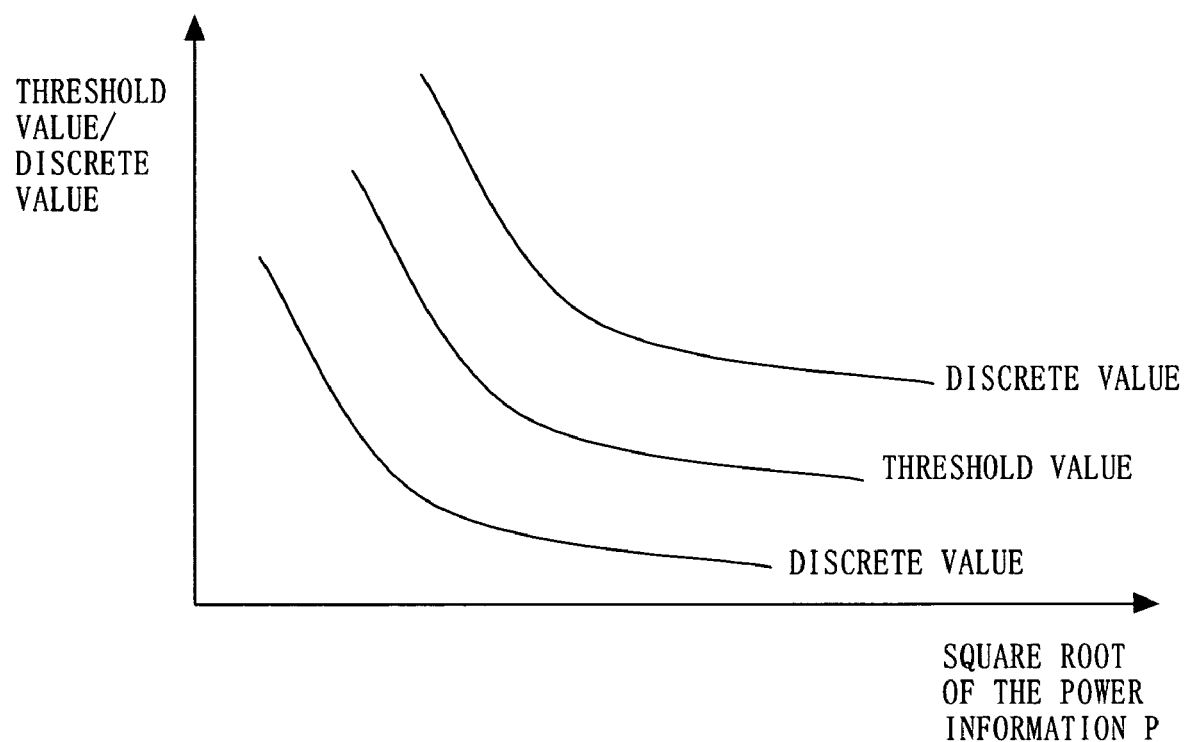
FIG. 13 shows the relationship between the threshold value and the discrete values changeable by a quantization section 122b.

Specifically, the quantization section 122*b* changes the levels of the threshold value and the discrete values so as to be in inverse proportion to the magnitude of the square root of the power information P. FIG. 13 shows the relationship between the threshold value and the discrete values changeable by the quantization section 122*b*. Referring to FIG. 13, for example, when the magnitude of the power information P is quadrupled, the quantization section 122*b* halves the levels of the threshold value and the discrete values. The quantization section 122*b* may change the levels of the threshold value and the discrete values using table information having a preset optimum relationship, instead of changing the levels so as to be in inverse proportion to the magnitude of the square root of the power information P.

Referring to FIG. 12, part (b), when the input power information P is large, the quantization section 122*b* decreases the threshold value; where as when the input power information P is small, the quantization section 122*b* increases the threshold value. Referring to FIG. 12, part (c), the quantization section 122*b* determines whether or not the maximum value of the amplitude signal M(t) exceeds the threshold value, and selects a discrete value to be output based on the determination result. The signal which is output from the determination and quantization section 12*b* is converted into an analog signal by the D/A converter 123 and is input to the multiplication type D/A converter 226. The multiplication type D/A converter 226 receives the power information P via the input terminal 222. Referring to FIG. 12, part (d), the multiplication type D/A converter 226 adjusts the magnitude of the output signal in accordance with the power information P. The signal which is output from the multiplication type D/A converter 226 is output from the output terminal 223 as the discrete value Vp(t). In this way, the signal processing section 22*b* controls the magnitude of the discrete value Vp(t) to be output in accordance with the power information P, and thus adjusts the voltage supplied from the regulator 14 to the amplification section 15 to an optimum level.

Figure 14:
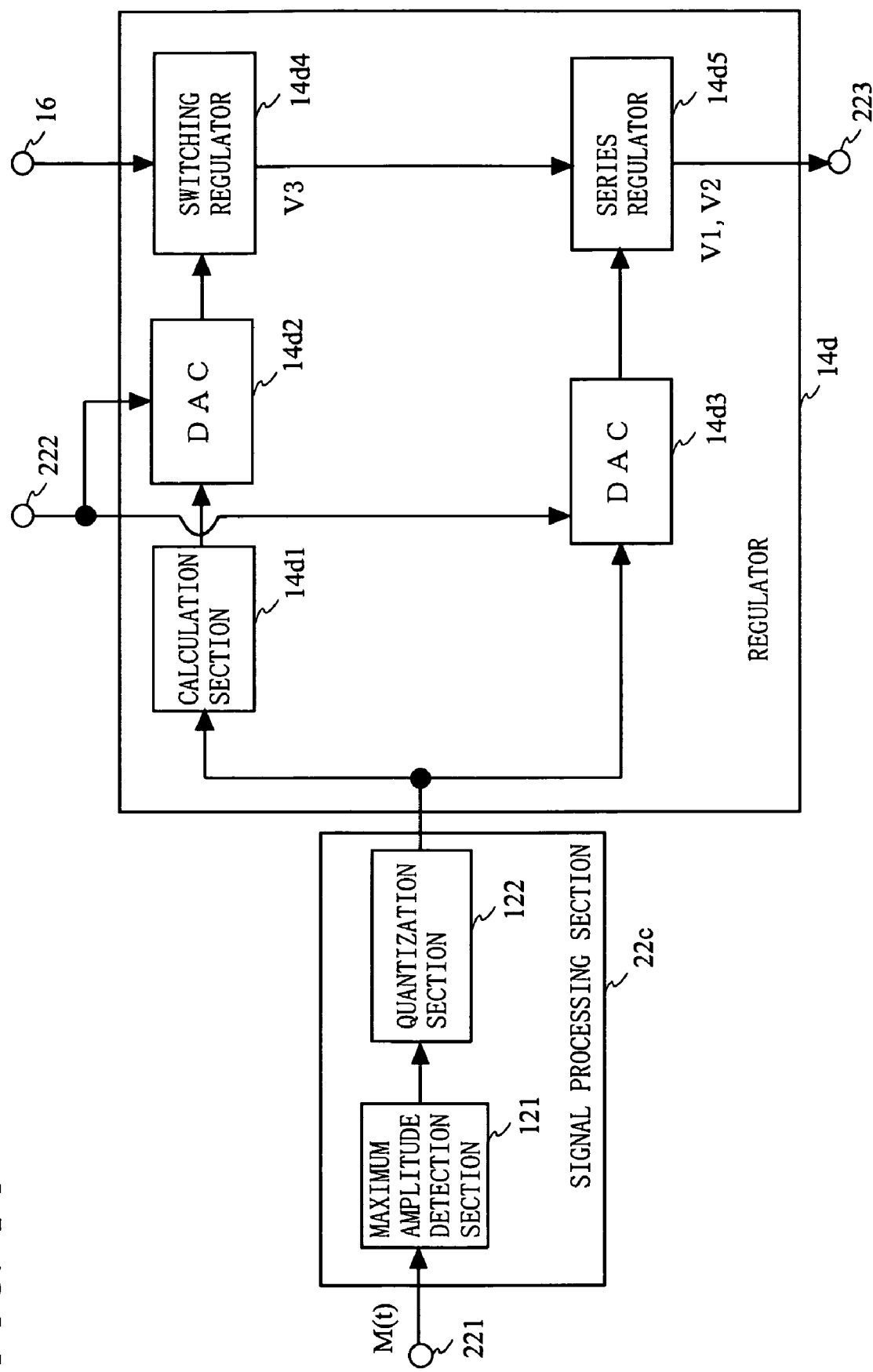
FIG. 14 is a block diagram showing an exemplary structure of a signal processing section 22c and a regulator 14d.

The transmission circuit 2 according to the second embodiment may include a signal processing section 22*c* and a regulator 14*d* having a structure shown in FIG. 14, in order to reduce the power consumption. FIG. 14 is a block diagram showing an exemplary structure of the signal processing section 22*c* and the regulator 14*d*. As shown in FIG. 14, the signal processing section 22*c* includes a maximum amplitude detection section 121 and a quantization section 122. The regulator 14*d* includes a calculation section 14*d*1, a D/A converter 14*d*2, a D/A converter 14*d*3, a switching regulator 14*d*4, and a series regulator 14*d*5. The switching regulator 14*d*4 has substantially the same structure as that of the switching regulator 14*b* shown in FIG. 5B. The series regulator 14*d*5 has substantially the same structure as that of the series regulator 14*a* shown in FIG. 5A.

Figure 15:
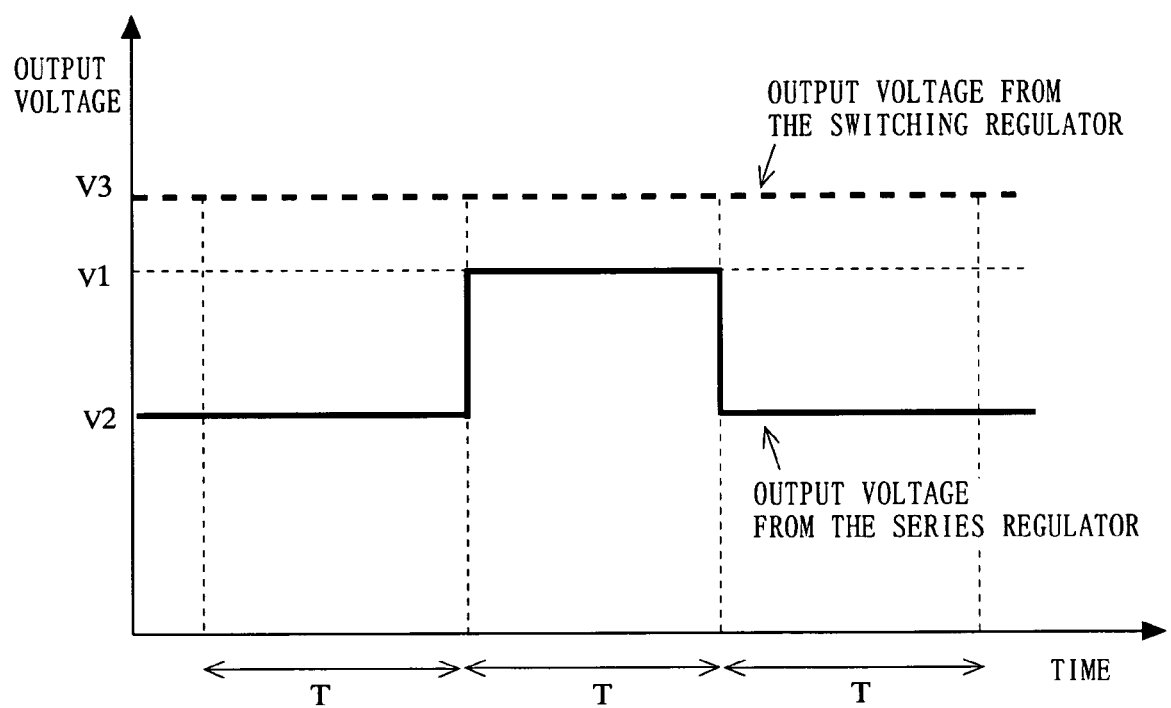
FIG. 15 shows output voltages from a switching regulator 14d4 and a series regulator 14d5.

In the signal processing section 22*c*, the maximum amplitude detection section 121 and the quantization section 122 perform substantially the same processing as that in the first embodiment. An output signal from the quantization section 122 is input to the calculation section 14*d*1 and the D/A converter 14*d*3. At this point, the output signal from the quantization section 122 is quantized into binary signals B1 and B2. It is assumed here that the magnitudes of the output voltages from the output terminal 223 corresponding to the binary signals B1 and B2 are V1 and V2. It is also assumed that V1>V2, and that the B1:B2 ratio is equal to the V1:V2 ratio. FIG. 15 shows the output voltages from the switching regulator 14*d*4 and the series regulator 14*d*5. The dashed line represents the output voltage from the switching regulator 14*d*4, and the solid line represents the output voltage from the series regulator 14*d*5.

In this case, the output voltage from the switching regulator 14*d*4 is preferably V3, which is slightly higher than V1. If a voltage significantly higher than V1 is supplied to the series regulator 14*d*5, the thermal loss in the series regulator 14*d*5 becomes excessive. The calculation section 14*d*1 performs calculation processing on the signal which is input from the quantization section 122, such that the switching regulator 14*d*4 supplies a voltage V3 slightly higher than V1 to the series regulator 14*d*5.

The output voltage from the switching regulator 14*d*4 changes only when the output power from the transmission circuit 2 changes. Therefore, the output voltage from the switching regulator 14*d*4 changes more slowly than the amplitude signal M(t), which allows the switching frequency or the clock frequency to be reduced. For this reason, the switching regulator 14*d*4 operates at a high efficiency. In addition, the thermal loss in the series regulator 14*d*5 is reduced, and therefore the power consumption of the regulator 14*d* is decreased. As a result, the entire power consumption of the transmission circuit 2 can be reduced. As the D/A converters 14*d*2 and 14*d*3, multiplication type D/A converters may be used. In this case, the D/A converters 14*d*2 and 14*d*3 receive the power information P from the input terminal.

Figure 16:
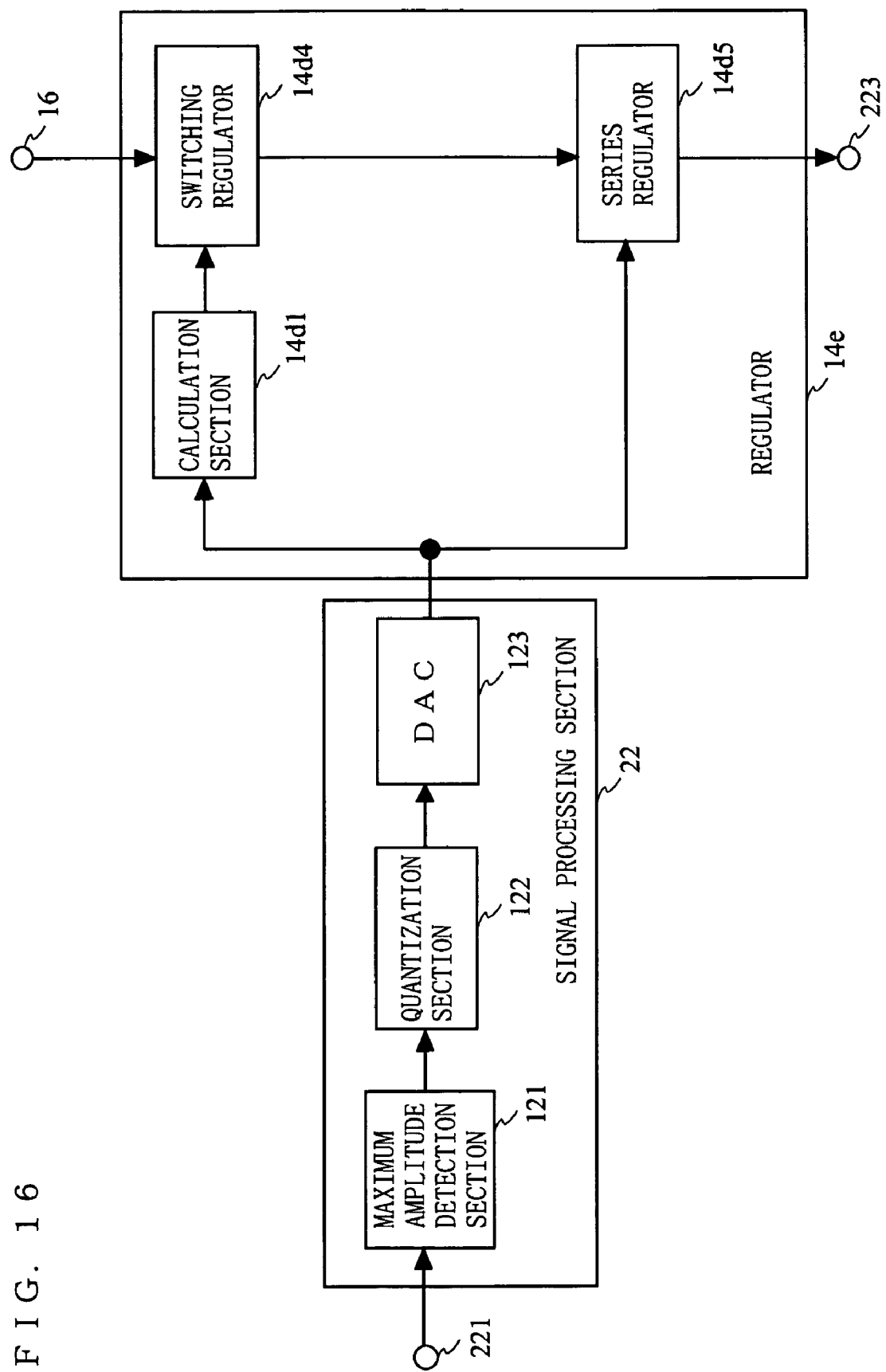
FIG. 16 is a block diagram showing an exemplary structure of a signal processing section 22 and a regulator 14e.

The transmission circuit 2 according to the second embodiment may include a signal processing section 22 and a regulator 14*e* shown in FIG. 16. FIG. 16 is a block diagram showing an exemplary structure of the signal processing section 22 and the regulator 14*e*. As shown in FIG. 16, the signal processing section 22 includes a maximum amplitude detection section 121, a quantization section 122, and a D/A converter 123. The regulator 14*e* includes a calculation section 14*d*1, a switching regulator 14*d*4, and a series regulator 14*d*5. The calculation section 14*d*1 outputs a signal obtained by offsetting the maximum value of the input signal by a predetermined value at an interval of the predetermined time period. Regarding the signal processing section 22 and the regulator 14*e*, elements identical to those described above bear the identical reference numerals thereto, and detailed descriptions thereof will be omitted.

As described above, the transmission circuit 2 according to the second embodiment of the present invention controls the gain of the variable gain amplification section 28 so as to amplify the modulated signal based on the power information P, which represents the magnitude of the transmission power required for communication with the base station, and also controls the magnitude of the signal to be output from the signal processing section 22 so as to adjust the voltage supplied from the regulator 14 to the amplification section 15 to an optimum level. Thus, the transmission circuit 2 can operate at a higher efficiency and a lower distortion than in the first embodiment.

Third Embodiment

Figure 17:
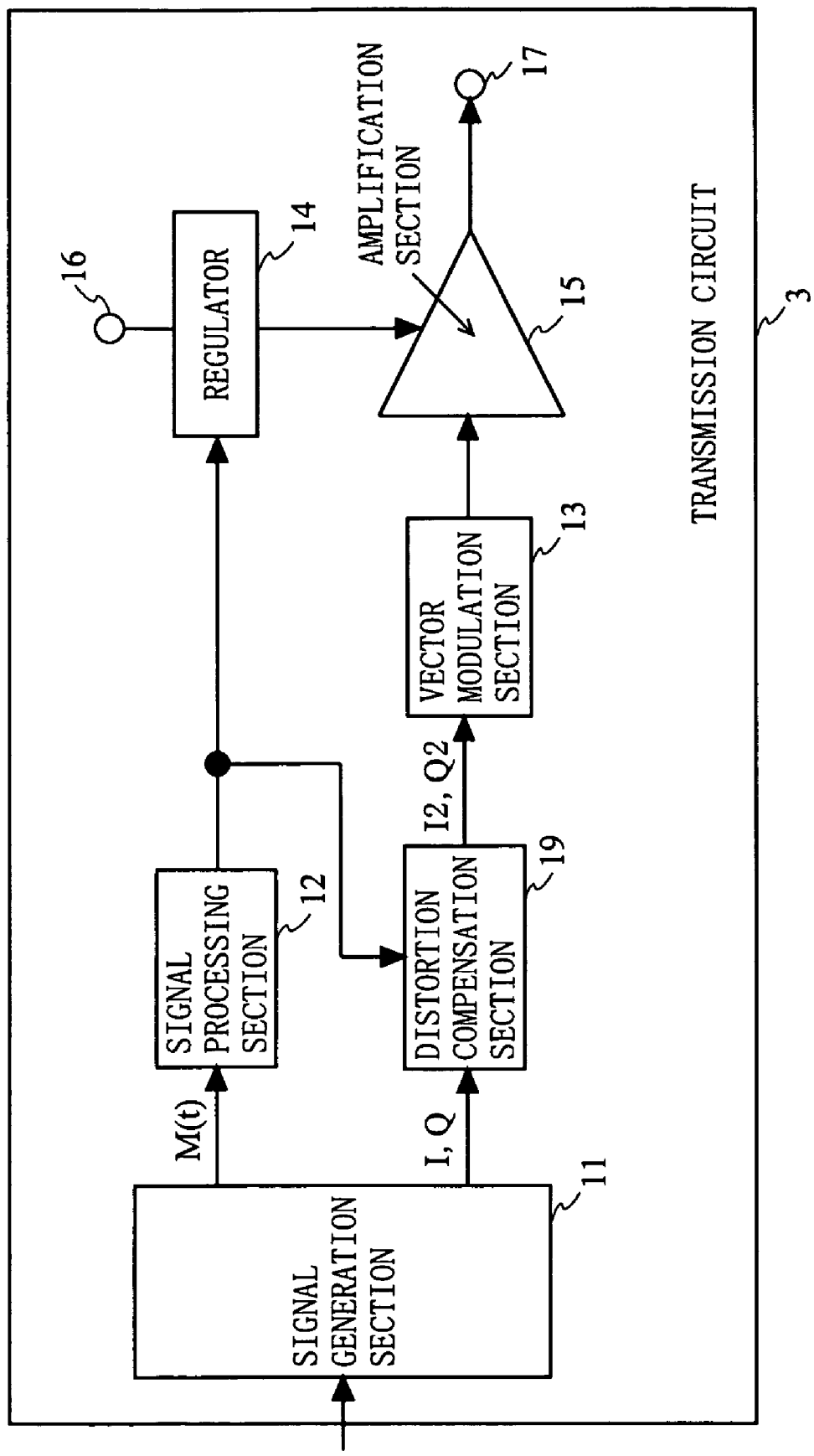
FIG. 17 is a block diagram showing an exemplary structure of a transmission circuit 3 according to a third embodiment of the present invention.

FIG. 17 is a block diagram showing an exemplary structure of a transmission circuit 3 according to a third embodiment of the present invention. As shown in FIG. 17, the transmission circuit 3 according to the third embodiment includes a distortion compensation section 19 in addition to the structure of the transmission circuit 1 according to the first embodiment. The distortion compensation section 19 distorts the I and Q signals to be input to the vector modulation section 13 beforehand in order to compensate for the distortion generated in the amplification section 15. The distortion compensation section 19 has a table stored therein usable to determine how much the I and Q signals should be distorted in terms of magnitude and phase with respect to the amplitude signal M(t). The distortion compensation section 19 distorts the I and Q signals and outputs I2 and Q2 signals. The I2 and Q2 signals can be expressed by expression (2). a(M) and θ(M) are correction values for the amplitude signal M(t) and are stored in the table.

$$I2+jQ2=a(M)(I+jQ)\exp(j\theta(M)) \qquad \text{expression (2)}$$

Figure 18:
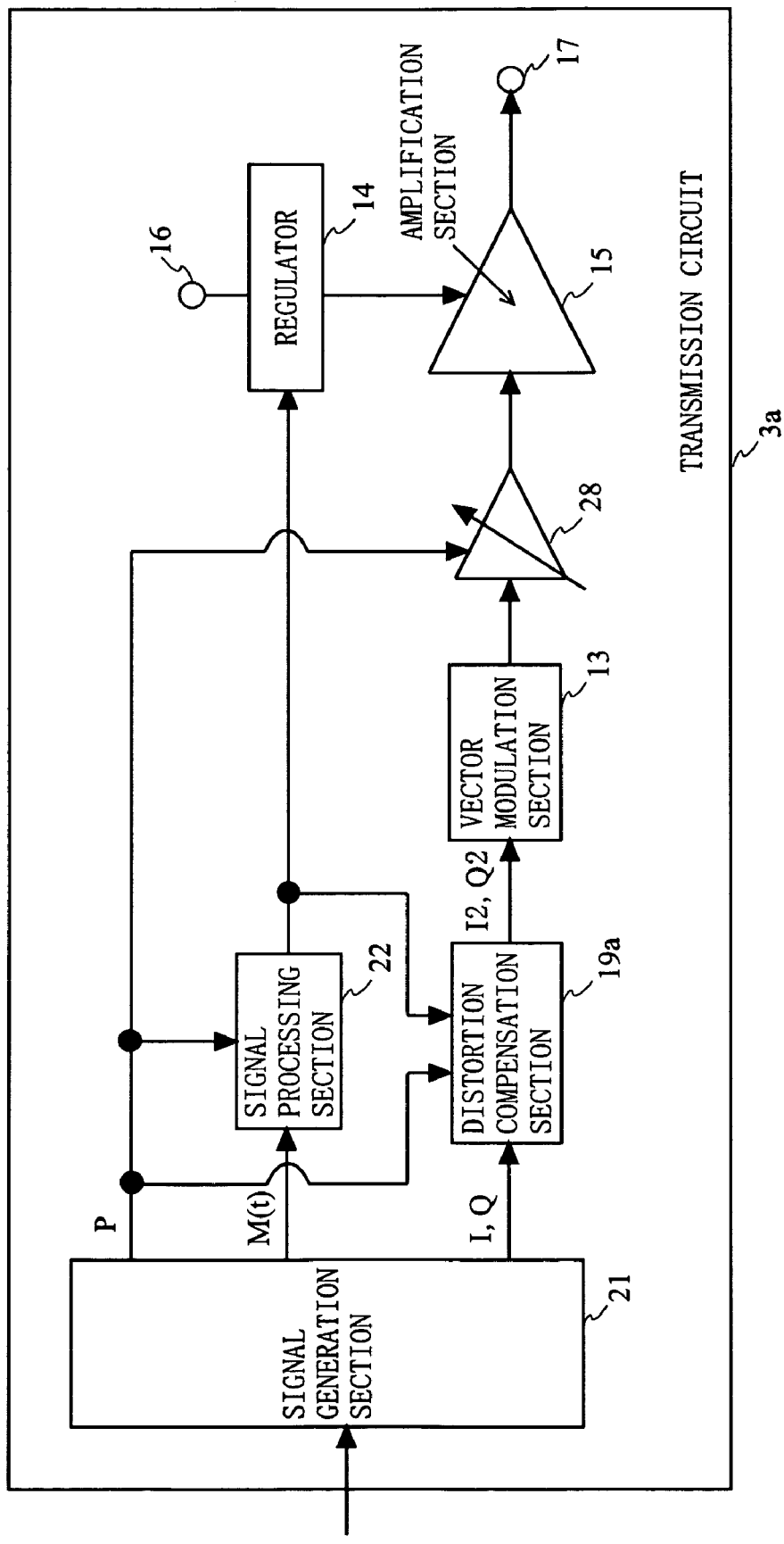
FIG. 18 is a block diagram showing an exemplary structure of a transmission circuit 3a obtained by applying a distortion compensation section to the transmission circuit according to the second embodiment.

The distortion compensation section may be applied to the transmission circuit (see FIG. 8) according to the second embodiment. FIG. 18 is a block diagram showing an exemplary structure of a transmission circuit 3a obtained by applying the distortion compensation section to the transmission circuit according to the second embodiment. As shown in FIG. 18, the transmission circuit 3a includes a distortion compensation section 19a in addition to the structure of the transmission circuit 2 according to the second embodiment. The distortion compensation section 19a distorts the I and Q signals to be input to the vector modulation section 13 beforehand based on the power information P in order to compensate for the distortion generated in the amplification section 15. The distortion compensation section 19a distorts the I and Q signals and outputs I2 and Q2 signals. The I2 and Q2 signals can be expressed by expression (3).

$$I2+jQ2=a(M,P)(I+jQ)\exp(j\theta(M,P)) \qquad \text{expression (3)}$$

As described above, a transmission circuit according to the third embodiment includes a distortion compensation section for compensating for the distortion generated in the amplification section 15, in addition to the structure of the transmission circuits according to the first and second embodiments. Such a transmission circuit can operate at a lower distortion than the transmission circuits according to the first and second embodiments.

Fourth Embodiment

Figure 19:
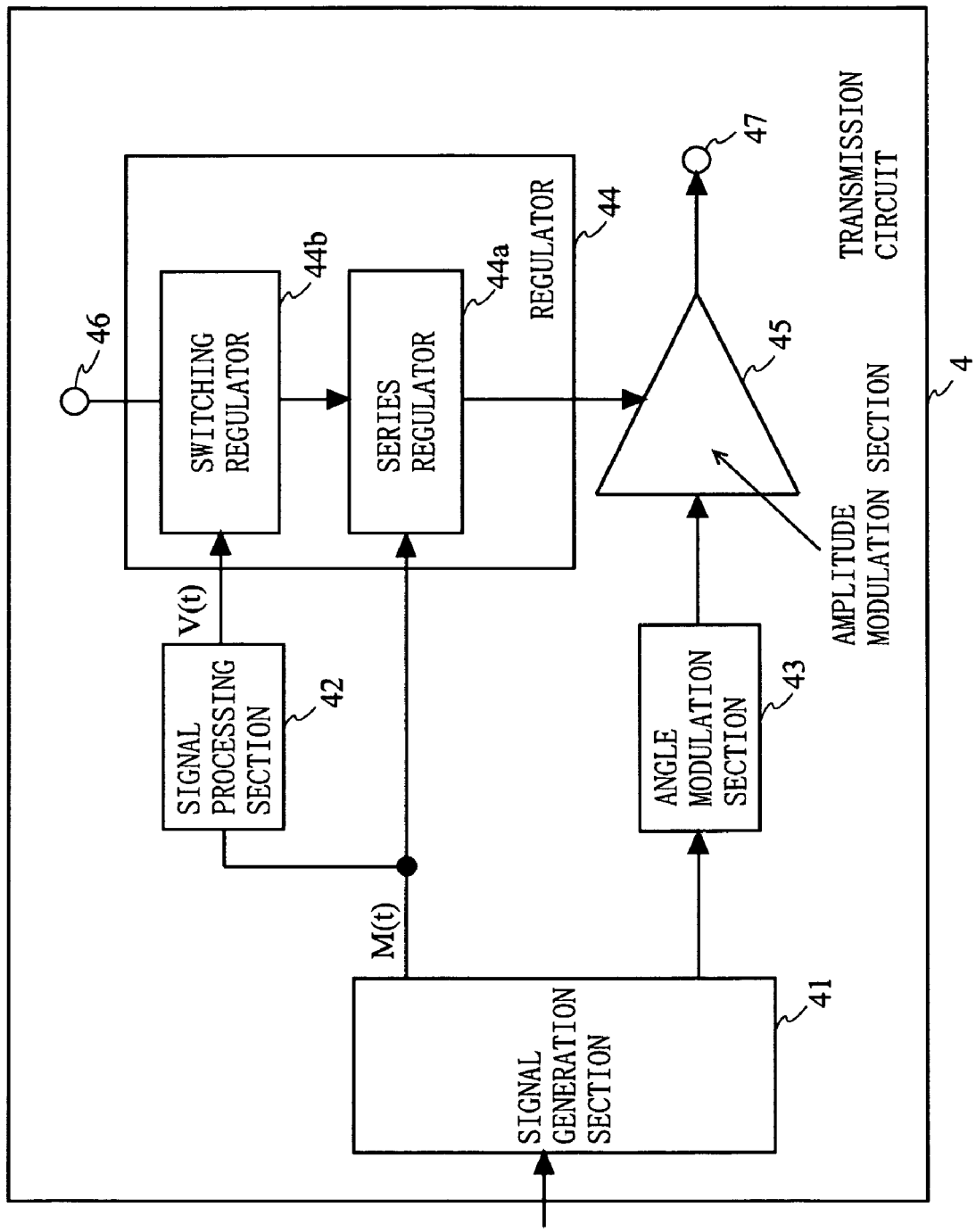
FIG. 19 is a block diagram showing an exemplary structure of a transmission circuit 4 according to a fourth embodiment of the present invention.

FIG. 19 is a block diagram showing an exemplary structure of a transmission circuit 4 according to a fourth embodiment of the present invention. As shown in FIG. 19, the transmission circuit 4 includes a signal generation section 41, a signal processing section 42, an angle modulation section 43, a regulator 44, an amplitude modulation section 45, a power supply terminal 46, and an output terminal 47. The regulator 44 includes a series regulator 44a and a switching regulator 44b.

The signal generation section 41 performs predetermined signal processing on input data and generates an amplitude signal M(t) and a phase signal. The amplitude signal M(t) is input to the signal processing section 42 and the series regulator 44a. The signal processing section 42 performs substantially the same processing as that in the first embodiment, i.e., selects a discrete value in accordance with the maximum value of the amplitude signal M(t) at an interval of a predetermined time period and outputs a signal having the selected discrete value to as a discrete value V(t). The discrete value V(t) is input to the switching regulator 44b. The switching regulator 44b is supplied with a DC voltage from the power supply terminal 46. The switching regulator 44b supplies a voltage controlled in accordance with the input discrete value V(t) to the series regulator 44a.

The series regulator 44a amplifies the input amplitude signal M(t) with the voltage supplied from the switching regulator 44b, and thus supplies a voltage controlled in accordance with the magnitude of the amplitude signal M(t) to the amplitude modulation section 45. Since the voltage supplied from the switching regulator 44b is controlled in accordance with the discrete value V(t), the series regulator 44a can operate at a high efficiency.

The phase signal is input to the angle modulation section 43. The angle modulation section 43 performs angle modulation on the phase signal and outputs an angle modulated signal. The angle modulated signal is input to the amplitude modulation section 45. The amplitude modulation section 45 performs amplitude modulation on the angle modulated signal with the voltage supplied from the series regulator 44a, and outputs the resultant signal as a modulated signal obtained as a result of angle modulation and amplitude modulation. The modulated signal is output from the output terminal 47 as a transmission signal.

The switching regulator 44b has substantially the same structure as that of the switching regulator 14b shown in FIG. 5B. The series regulator 44a has substantially the same structure as that of the series regulator 14a shown in FIG. 5A. The amplitude modulation section 45 has substantially the same structure as that of the amplification section 15a shown in FIG. 6A or the amplification section 15b shown in FIG. 6B.

Figure 20A:
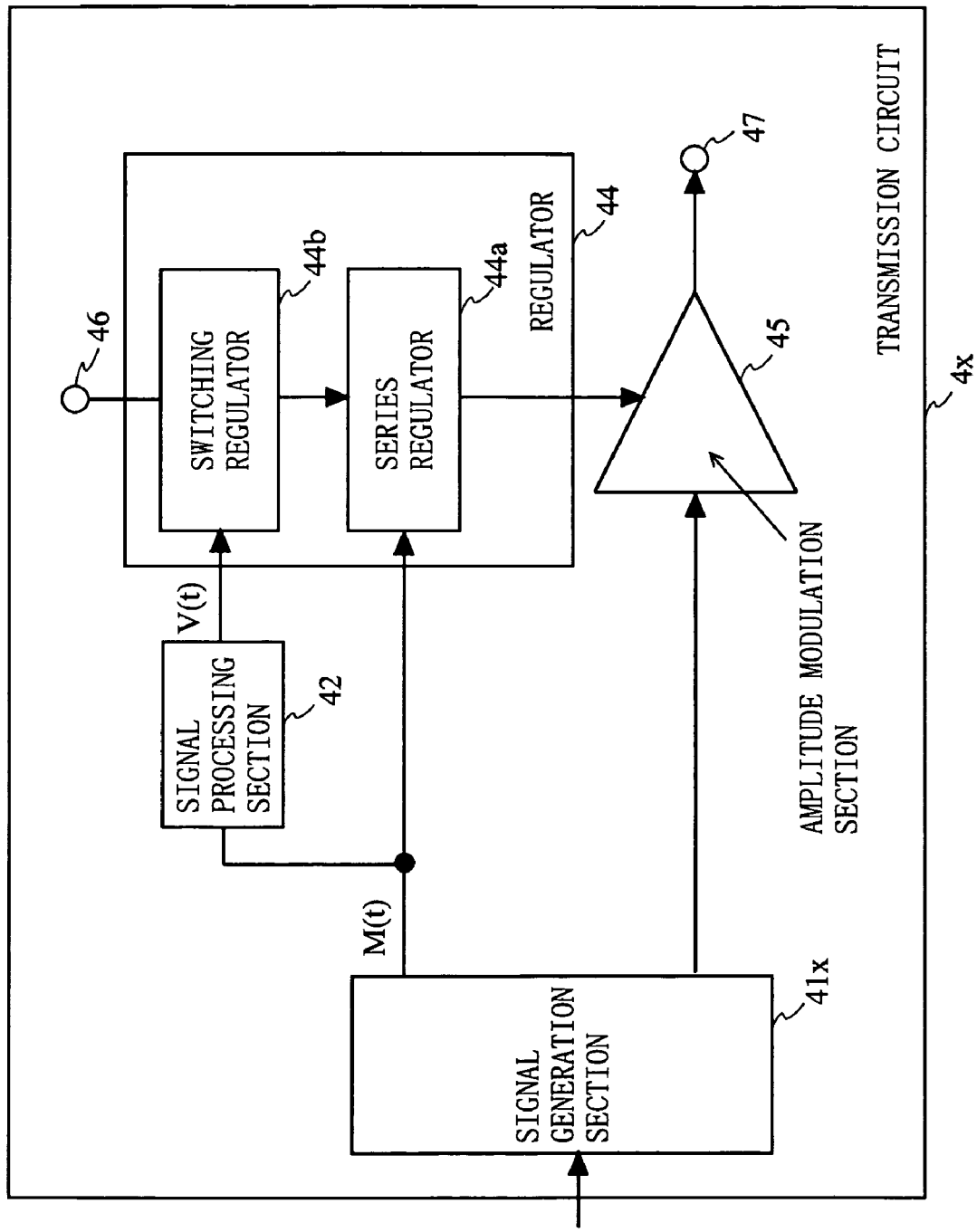
FIG. 20A is a block diagram showing an exemplary structure of a transmission circuit 4x according to the fourth embodiment of the present invention.

The transmission circuit 4 may have a different structure from that of FIG. 19. FIG. 20A is a block diagram showing an exemplary structure of a transmission circuit 4x according to the fourth embodiment of the present invention. As shown in FIG. 20A, the transmission circuit 4x includes a signal generation section 41x, a signal processing section 42, a regulator 44, an amplitude modulation section 45, a power supply terminal 46, and an output terminal 47. Regarding the transmission circuit 4x, elements identical to those of the transmission circuit 4 bear the identical reference numerals thereto, and detailed descriptions thereof will be omitted.

Referring to FIG. 20A, the signal generation section 41x outputs an amplitude signal M(t) and an angle modulated signal. FIG. 20B is a block diagram showing an exemplary structure of the signal generation section 41x. As shown in FIG. 20B, the signal generation section 41x includes a quadrature signal generation section 413, a vector modulation section 414, an envelope detection section 415, and a limiter 416. The quadrature signal generation section 413 performs signal processing on input data and generates I and Q signals, which are quadrature signals. The I and Q signals are input to the vector modulation section 414.

The vector modulation section 414 performs vector modulation on the I and Q signals. As the vector modulation section 414, a quadrature modulator, for example, is used. The signal which is output from the vector modulation section 414 is input to the envelope detection section 415 and the limiter 416. The envelope detection section 415 detects an envelope component of the signal which is output from the vector modulation section 414 and outputs the detected envelope component as the amplitude signal M(t). The limiter 416 limits the envelope component of the signal which is output from the vector modulation section 414 to a certain magnitude, and outputs the magnitude limited signal as the angle modulated signal.

As described above, with the transmission circuit 4 according to the fourth embodiment of the present invention, when the amplitude signal M(t) which is output from the signal generation section 41 is large, the non-linearity of the amplitude modulation section 45 can be alleviated by raising the collector voltage or the drain voltage supplied from the regulator 44 to the amplitude modulation section 45. Since the voltage to be supplied to the amplitude modulation section 45 is raised only during a necessary time period, a high efficiency can be realized. When the modulated signal M(t) is small, then on-linearity of the amplitude modulation section 45 can be alleviated by keeping the voltage to be supplied thereto at a constant level. Therefore, the modulated signal which is output from the amplitude modulation section 45 has a low distortion regardless of the magnitude of the amplitude signal M(t). Thus, the transmission circuit 4 can operate at a high efficiency and a low distortion by controlling the voltage to be supplied to the amplitude modulation section 45 to an optimum level.

Fifth Embodiment

Figure 21:
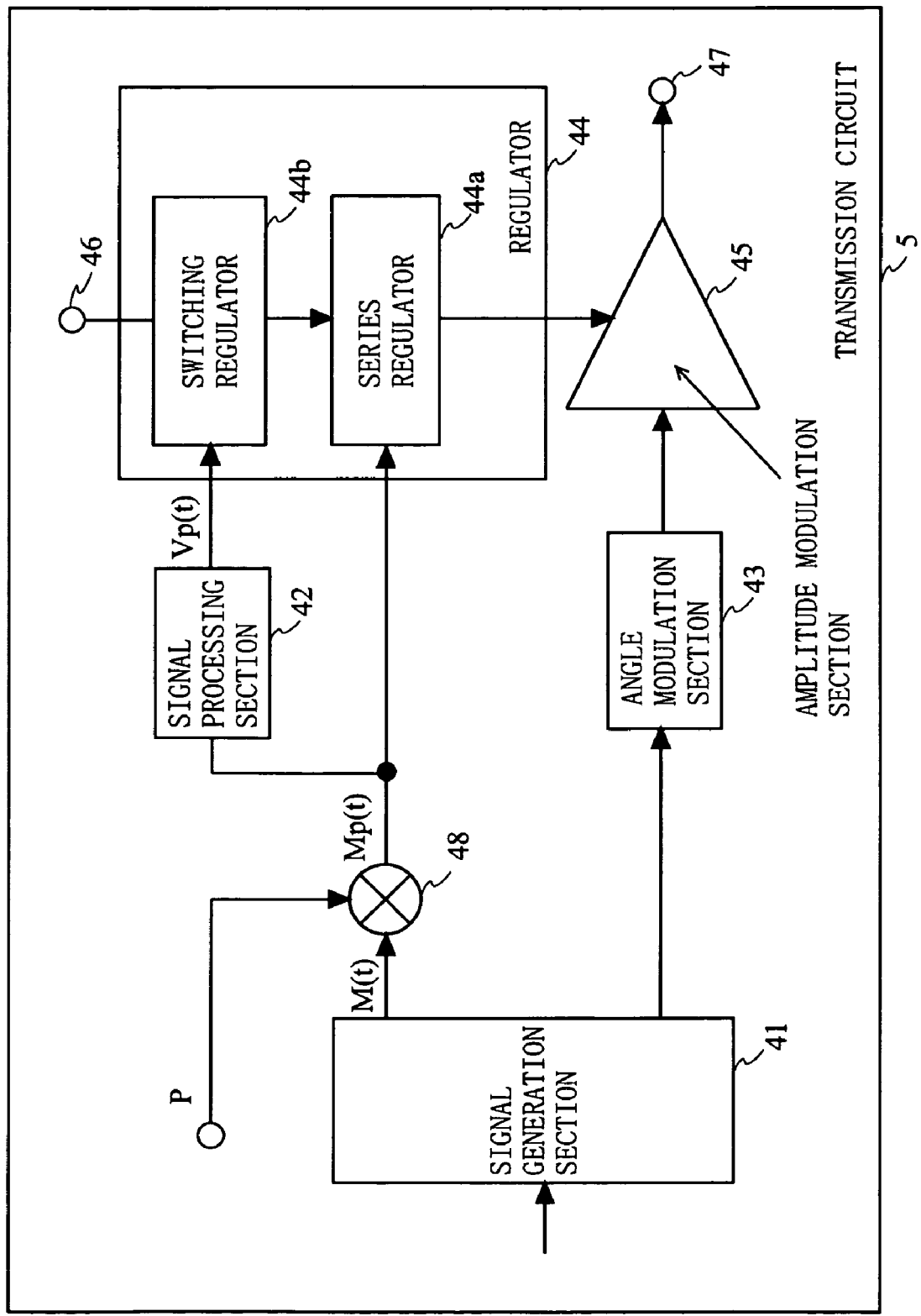
FIG. 21 is a block diagram showing an exemplary structure of a transmission circuit 5 according to a fifth embodiment of the present invention.
Figure 22:
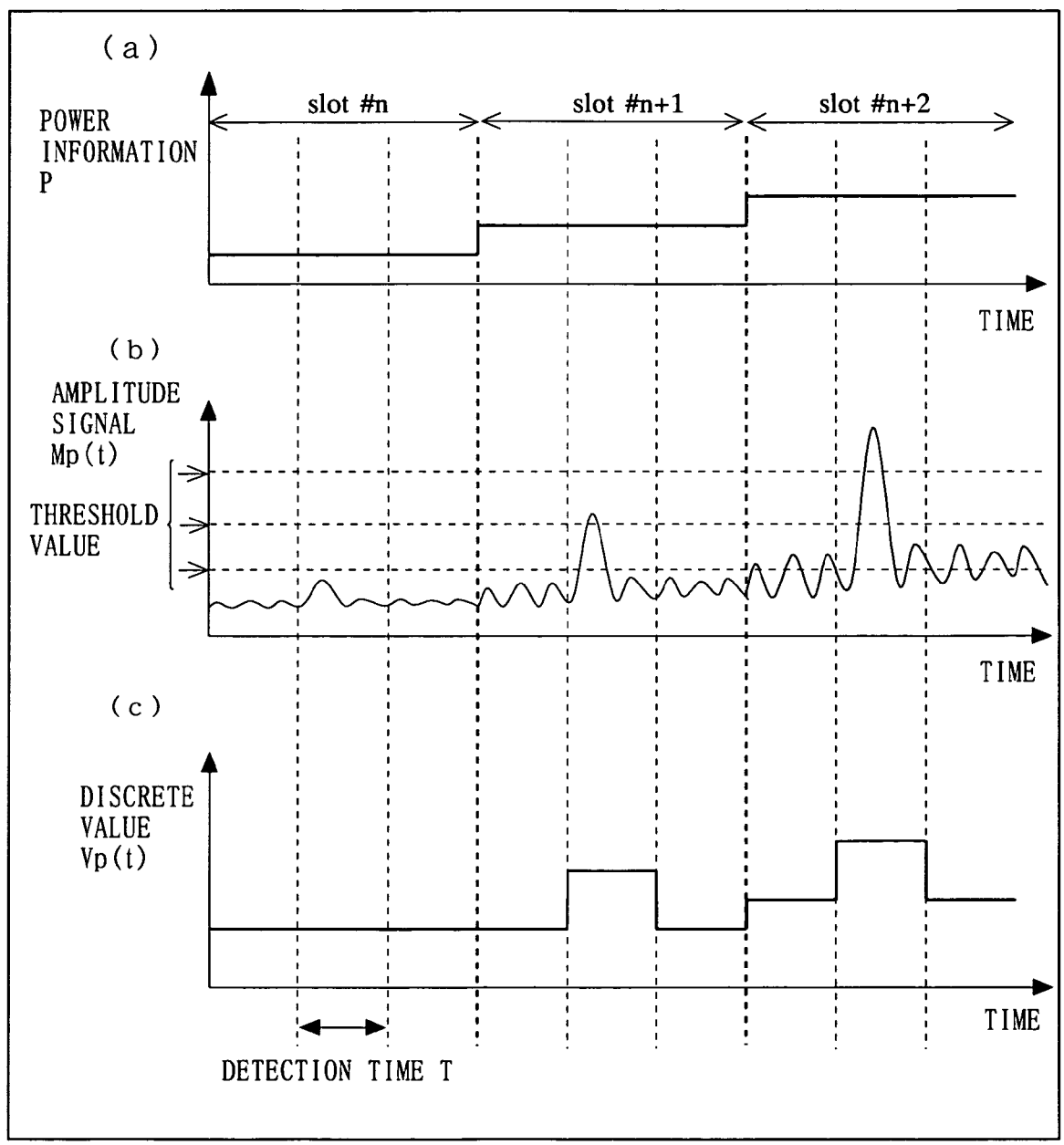
FIG. 22 shows an operation of the transmission circuit 5 according to the fifth embodiment of the present invention.

FIG. 21 is a block diagram showing an exemplary structure of a transmission circuit 5 according to a fifth embodiment of the present invention. As shown in FIG. 21, the transmission circuit 5 according to the fifth embodiment includes a multiplication section 48 on a stage post to the signal generation section 41 in addition to the structure of the transmission circuit 4 according to the fourth embodiment. Hereinafter, with reference to FIG. 22 (parts (a) through (c)), an operation of the transmission circuit 5 will be described. FIG. 22, part (a) shows an exemplary waveform of the power information P which is input to the multiplication section 48. FIG. 22, part (b) shows an exemplary waveform of an amplitude signal Mp(t) which is output from the multiplication section 48. FIG. 22, part (c) shows an exemplary waveform of a discrete value Vp(t) which is output from the signal processing section 42.

The multiplication section 48 receives the power information P, which represents the magnitude of the transmission power required for communication with the base station (see FIG. 22, part (a)). In the case of, for example, the W-CDMA system, the power information P is controlled by the base station, and the power for the transmission with the base station is controlled at each slot time. The transmission circuit 5 may have a structure in which the signal generation section 41 outputs the power information P based on information from the base station.

The multiplication section 48 multiplies the power information P and the amplitude signal M(t), and outputs the resultant signal as the amplitude signal Mp(t) (see FIG. 22, part (b)). The signal processing section 42 performs substantially the same processing as that in the first embodiment, i.e., selects a discrete value corresponding to the maximum value of the amplitude signal Mp(t) at an interval of a predetermined time period and outputs a signal having the selected discrete value as the discrete value V(t) (see FIG. 22, part (c)). In this example, the signal processing section 42 has three threshold values and four discrete values. The subsequent operation of the transmission circuit 5 is substantially the same as that in the fourth embodiment and will not be described here.

Figure 23:
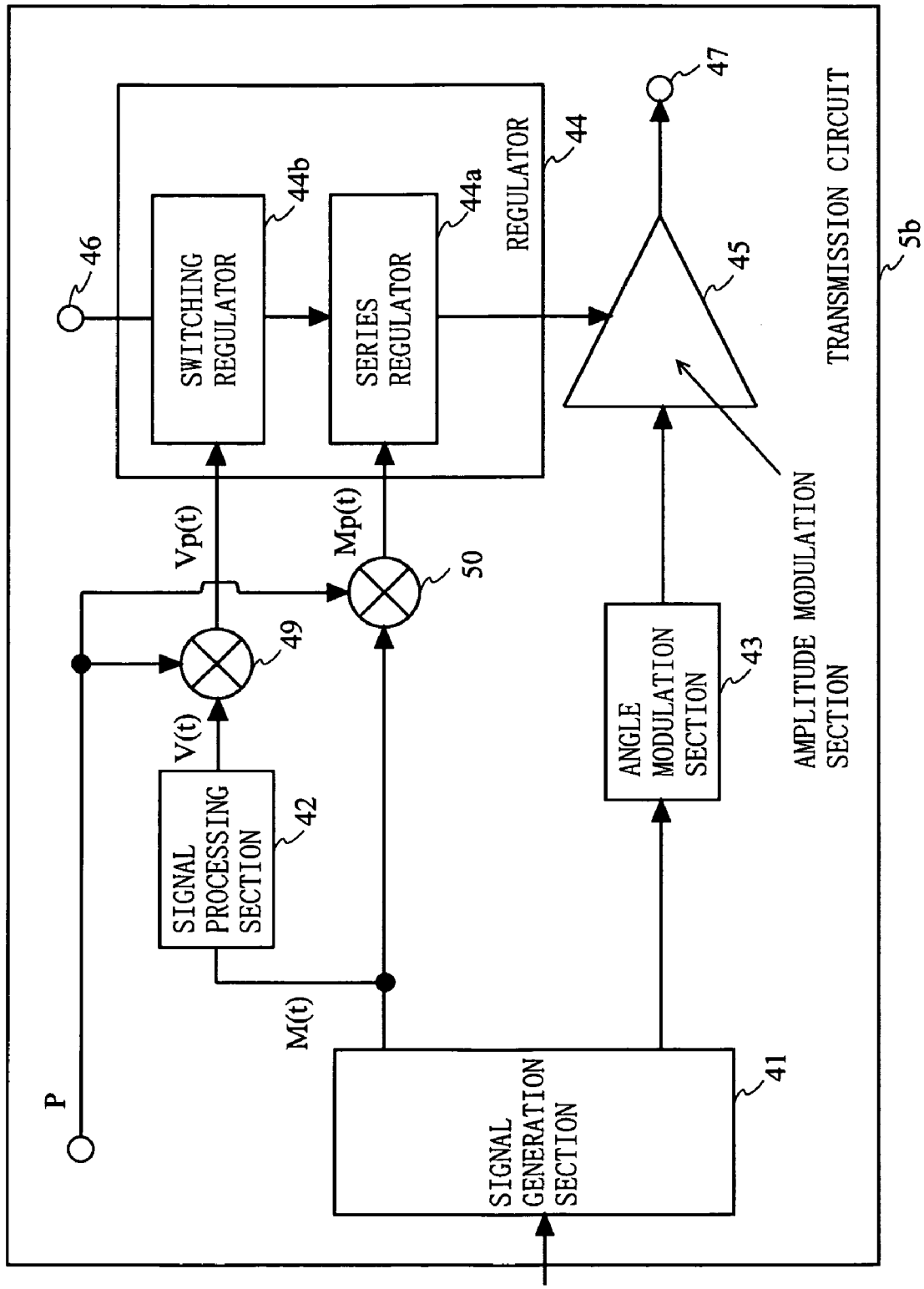
FIG. 23 is a block diagram showing an exemplary structure of a transmission circuit 5b according to the fifth embodiment of the present invention.

The transmission circuit 5 according to the fifth embodiment may have a structure shown in FIG. 23. FIG. 23 is a block diagram showing an exemplary structure of a transmission circuit 5b according to the fifth embodiment of the present invention. As shown in FIG. 23, the transmission circuit 5b includes a multiplication section 49 and a multiplication section 50 on a stage previous to the switching regulator 44b and the series regulator 44a in addition to the structure of the transmission circuit 4 according to the fourth embodiment. The multiplication section 49 multiplies the discrete value V(t) and the power information P, and outputs the resultant signal as the discrete value Vp(t). The multiplication section 50 multiplies the amplitude signal M(t) and the power information P, and outputs the resultant signal as the amplitude value Mp (t). The subsequent operation is substantially the same as that in the fourth embodiment.

As described above, the transmission circuit 5 according to the fifth embodiment of the present invention changes the magnitude of the amplitude signal M(t) based on the power information P, which represents the magnitude of the transmission power required for communication with the base station, and thus adjusts the voltage supplied from the regulator 44 to the amplitude modulation section 45 to an optimum level for the amplitude modulation section 45. Thus, the transmission circuit 5 can operate at a high efficiency and a low distortion.

Sixth Embodiment

Figure 24:
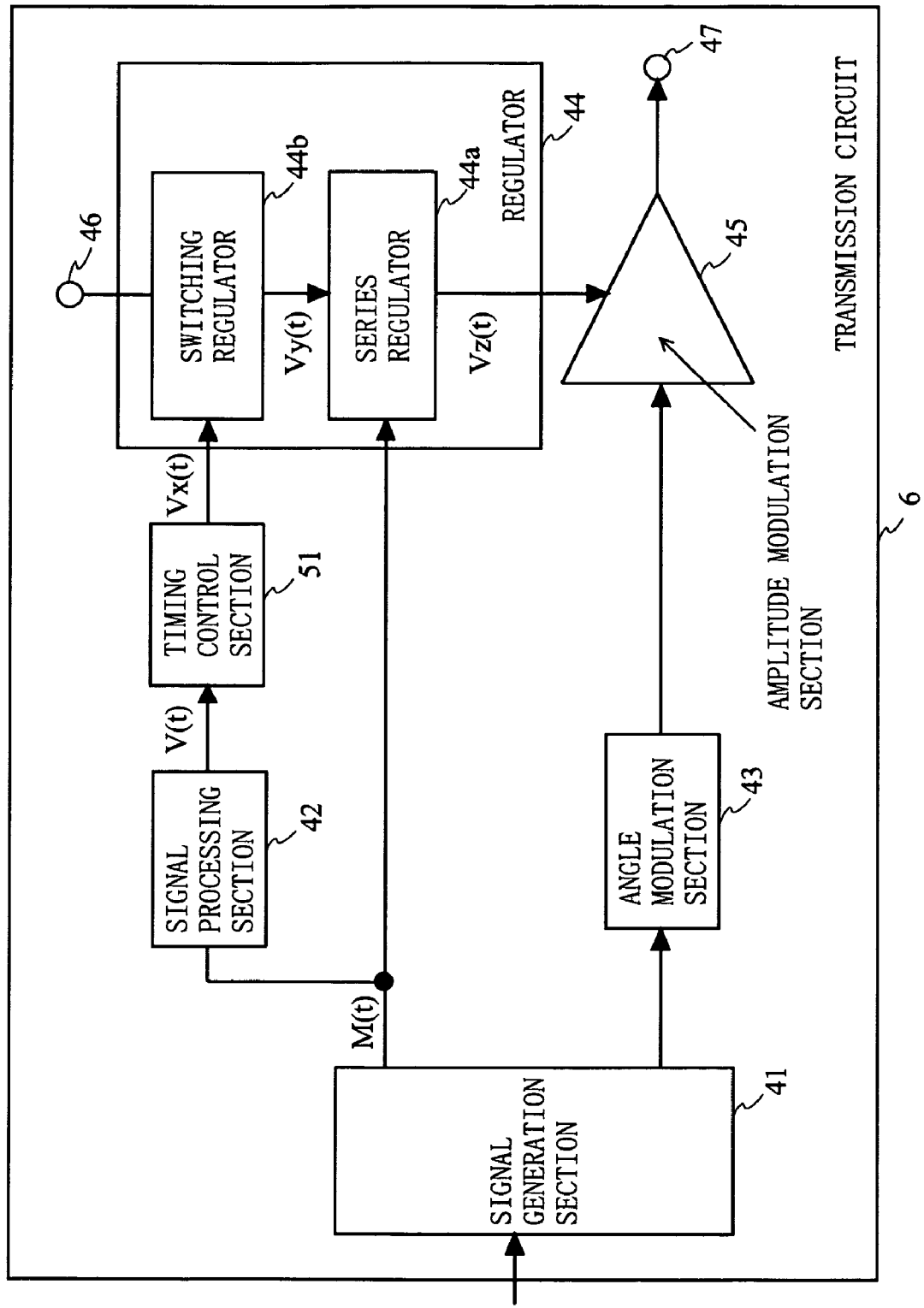
FIG. 24 is a block diagram showing an exemplary structure of a transmission circuit 6 according to a sixth embodiment of the present invention.

FIG. 24 is a block diagram showing an exemplary structure of a transmission circuit 6 according to a sixth embodiment of the present invention. As shown in FIG. 24, the transmission circuit 6 according to the sixth embodiment includes a timing control section 51 on a stage post to the signal processing section 42 in addition to the structure of the transmission circuit in the fourth and fifth embodiments. The timing control section 51 changes the timing at which the discrete value V(t) which is output from the signal processing section 42 is input to the switching regulator 44b.

Figure 25:
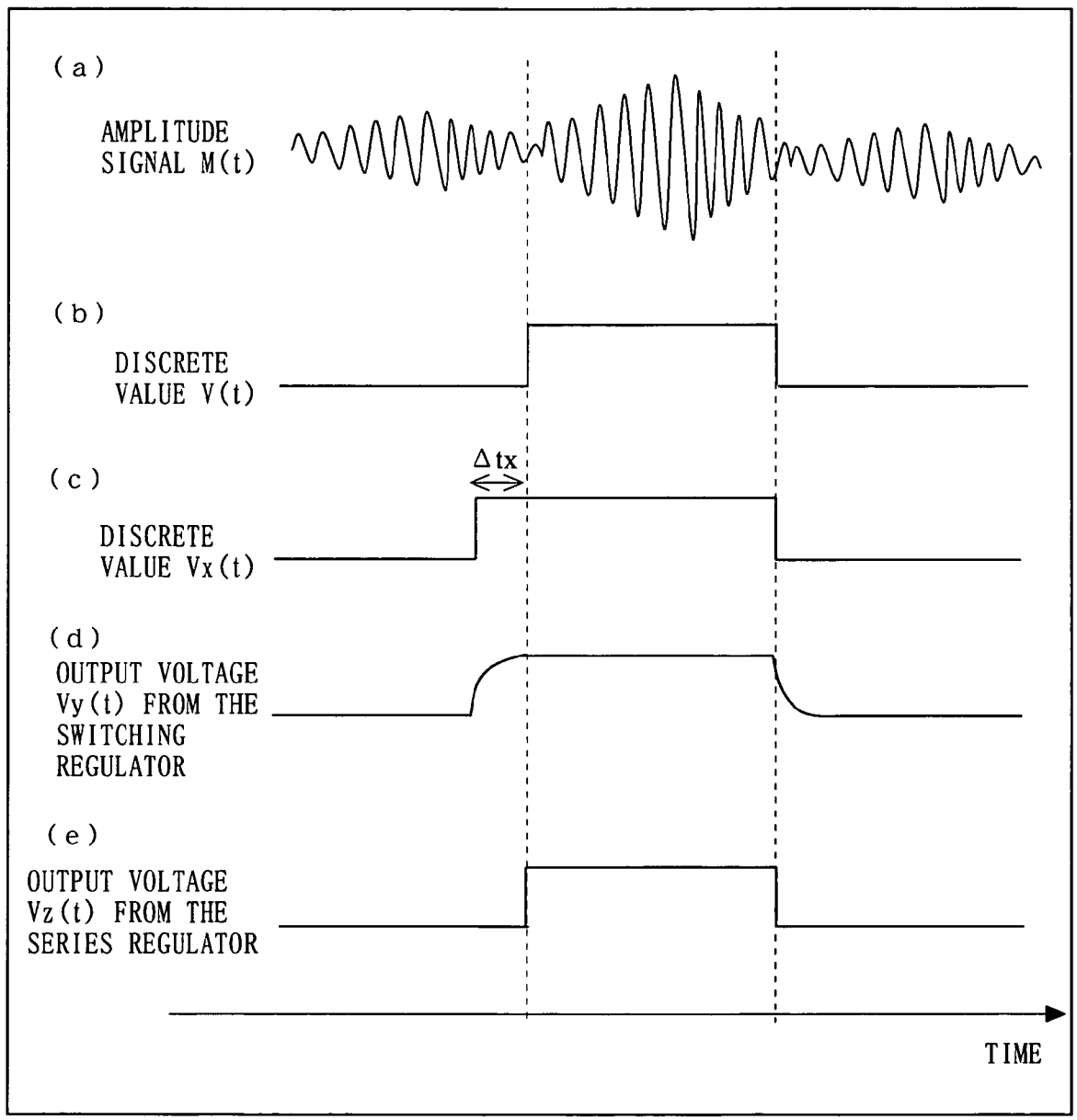
FIG. 25 is an exemplary timing diagram of signals handled by the transmission circuit 6.

FIG. 25 is an exemplary timing diagram of signals handled by the transmission circuit 6. Hereinafter, the transmission circuit 6 according to the sixth embodiment will be described with reference to FIG. 25. The signal processing section 42 receives an amplitude signal M(t) (see FIG. 25, part (a)) from the signal generation section 41. The signal processing section 42 performs substantially the same processing as that in the first embodiment and outputs a discrete value V(t) (see FIG. 25, part (b)). The discrete value V(t) is input to the timing control section 51.

In order to compensate for the start of the switching regulator 44b, the timing control section 51 advances the timing when to output the discrete value V(t) by Δtx, and outputs the resultant value as a discrete value Vx(t) (see FIG. 25, part (c)). Instead of the timing control section 51 advancing the timing when to output the discrete value V(t) by Δtx, the signal generation section 41 may delay the amplitude signal M(t) to be input to the series regulator 44a and the phase signal to be input to the angle modulation section 43 by Δtx.

The discrete value Vx(t) is input to the switching regulator 44b. The switching regulator 44b outputs a voltage Vy(t) controlled in accordance with the discrete value Vx(t) (see FIG. 25, part (d)). The voltage Vy(t) which is output from the switching regulator 44b is supplied to the series regulator 44a. The series regulator 44a outputs a voltage Vz(t) controlled in accordance with the amplitude signal M(t) based on the voltage Vy(t) supplied from the switching regulator 44b (see FIG. 25, part (e)). The voltage Vz(t) which is output from the series regulator 44a is supplied to the amplitude modulation section 45.

As described above, the transmission circuit 6 according to the sixth embodiment of the present invention includes the timing control section 51 on a stage post to the signal processing section 42, and thus solves the problem of the instability of the start of the switching regulator 44b and thus operates at a low distortion.

Figure 26:
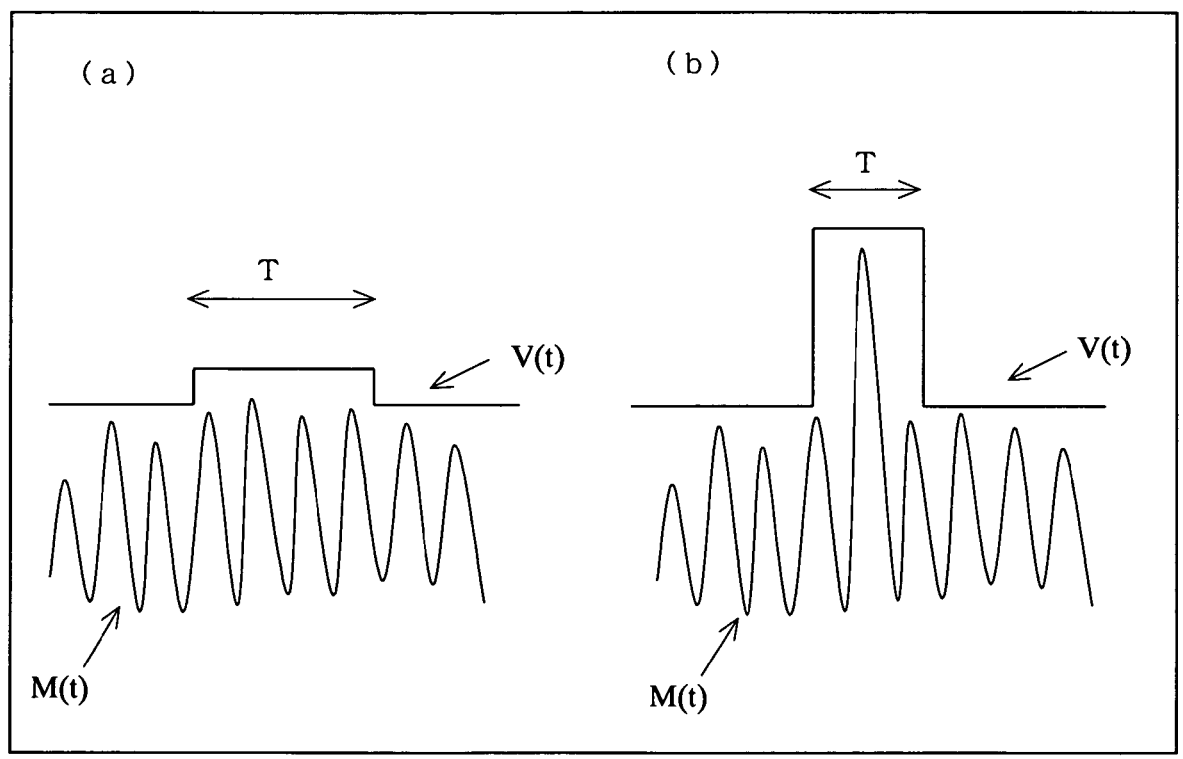
FIG. 26 shows the power consumption reduction effect realized when the length of the predetermined time period T is changed.
Figure 30:
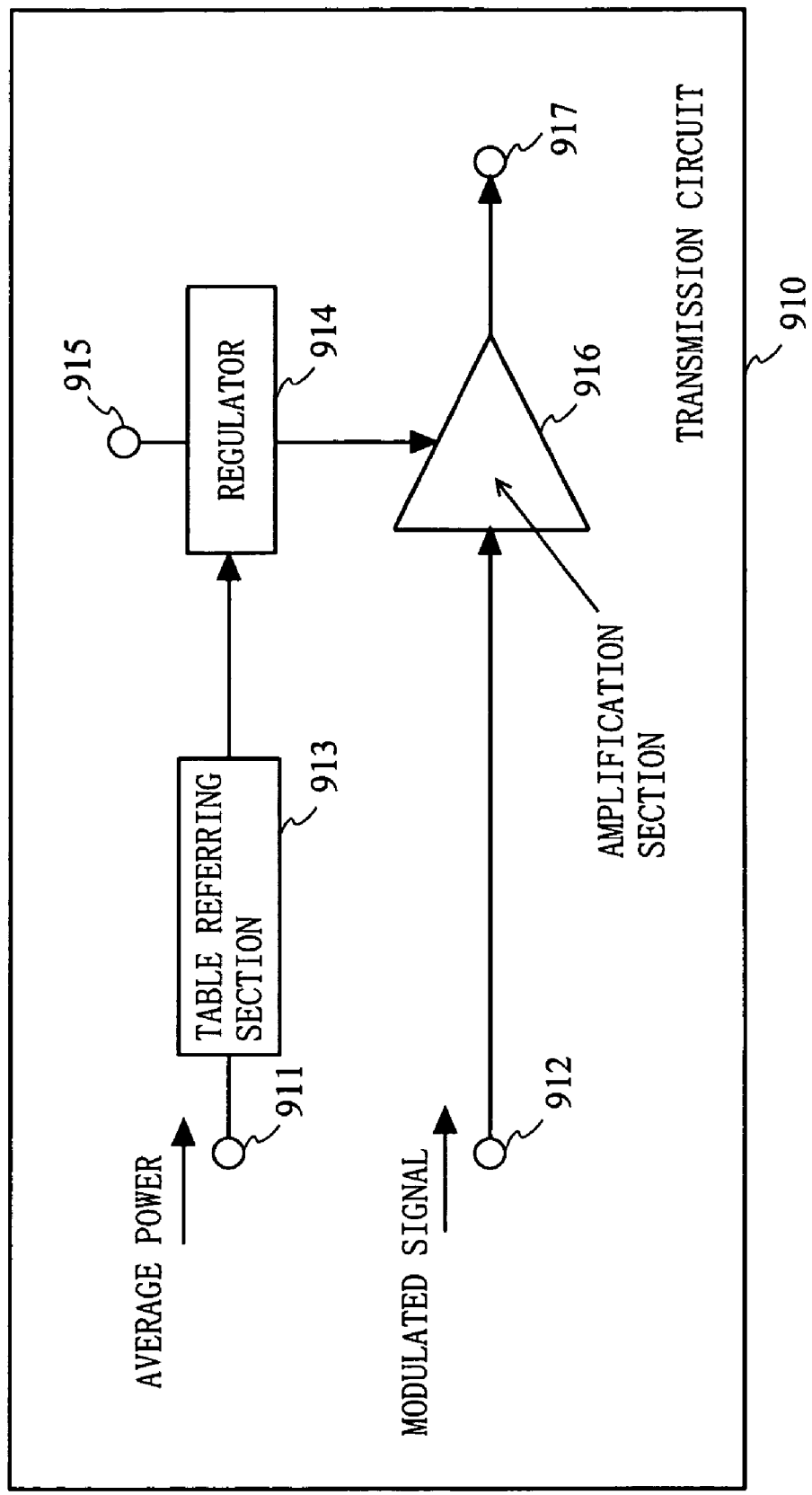
FIG. 30 is a block diagram showing an exemplary structure of a conventional transmission circuit 910.
Figure 31:
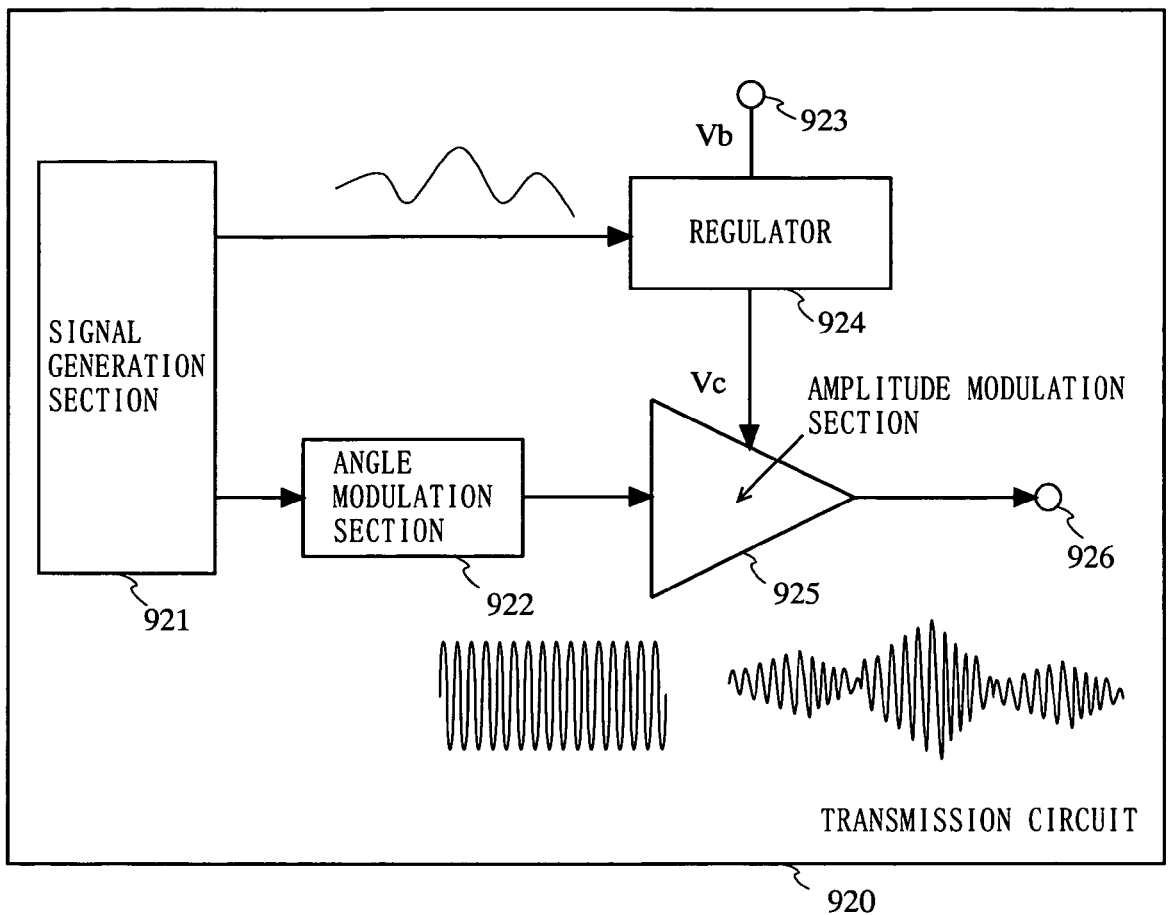
FIG. 31 is a block diagram showing an exemplary structure of a conventional transmission circuit 920.
Figure 32:
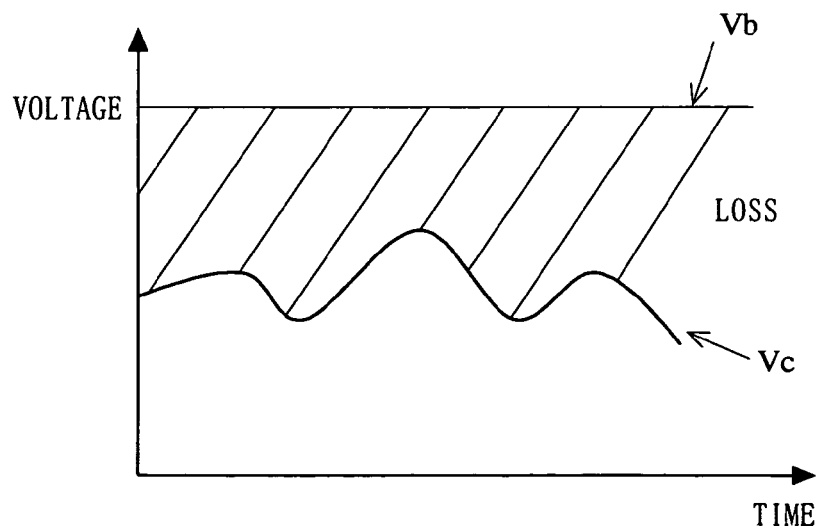
FIG. 32 shows a problem of the conventional transmission circuit 920.
Figure 33:
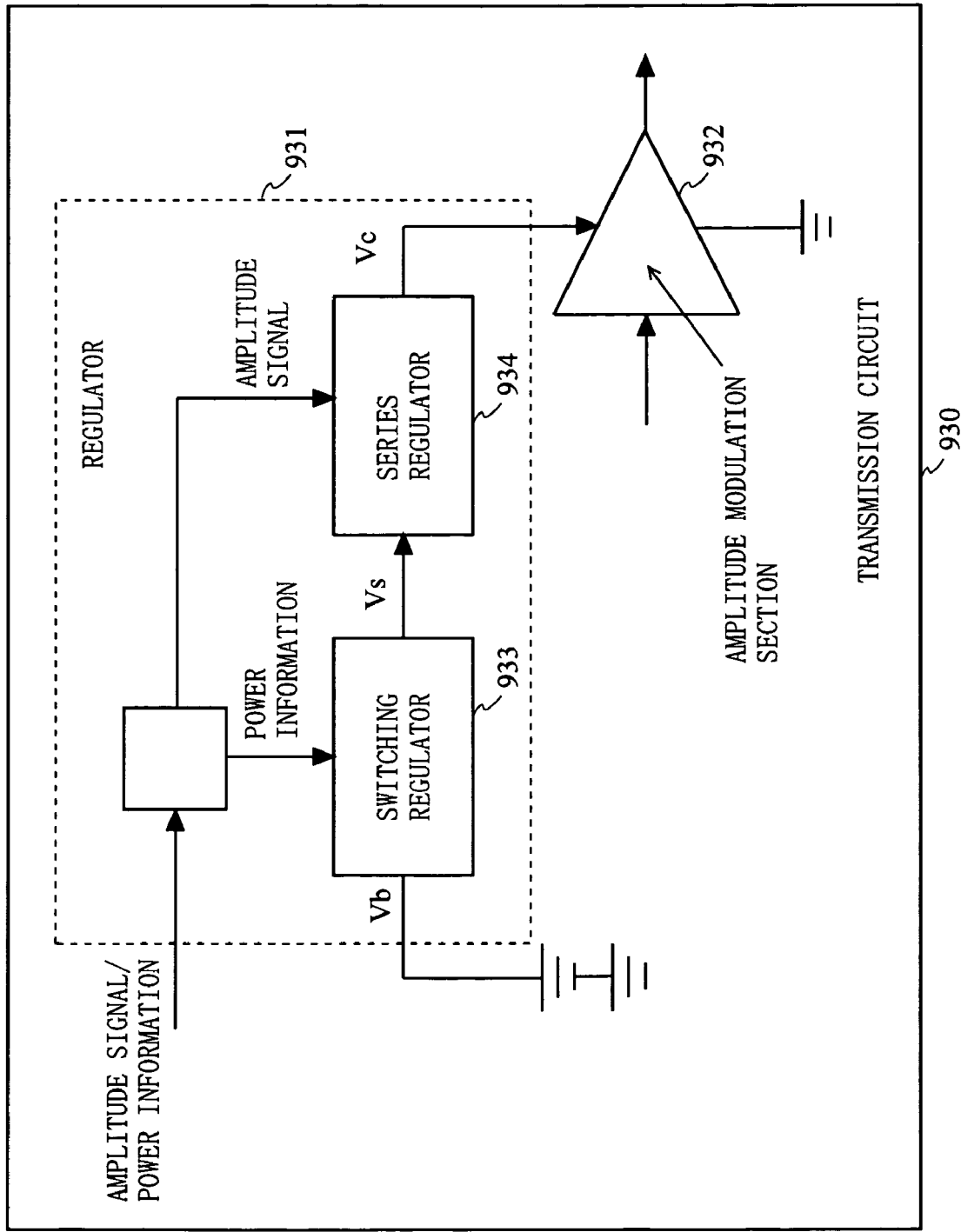
FIG. 33 is a block diagram showing an exemplary structure of a conventional transmission circuit 930.
Figure 34:
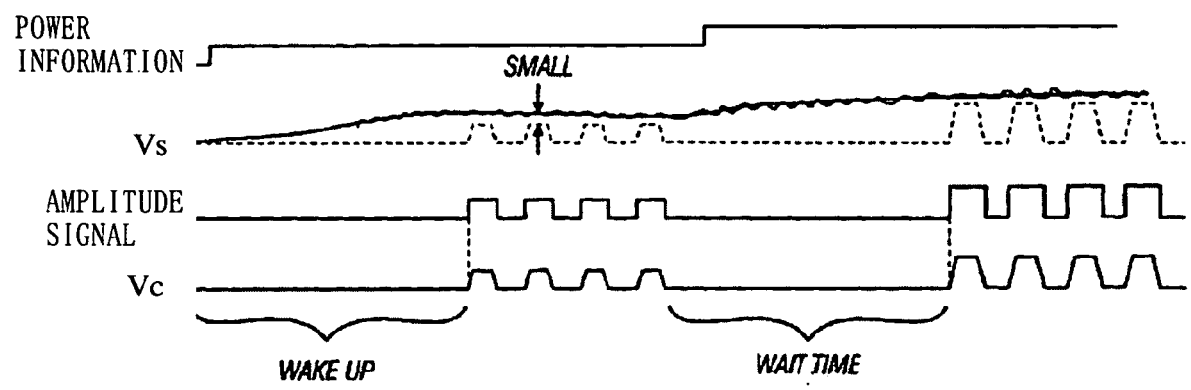
FIG. 34 shows an operation of a regulator 931 of the conventional transmission circuit 930.
Figure 35:
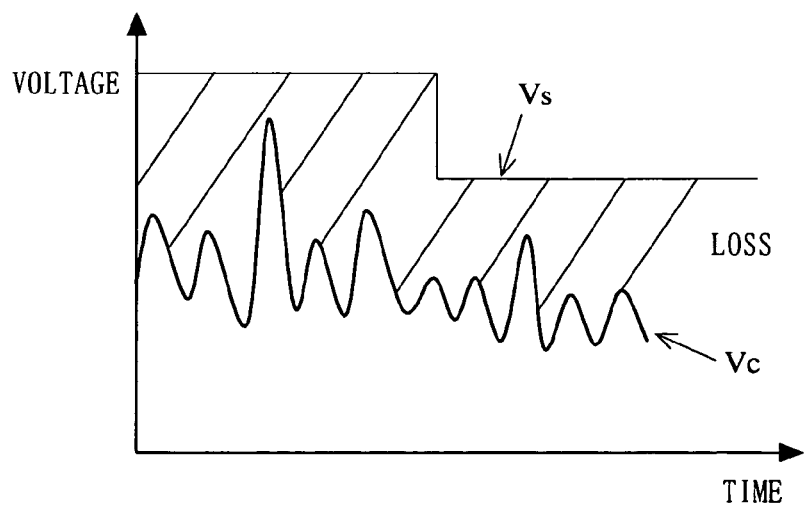
FIG. 35 shows a problem of the conventional transmission circuit 930.

In the transmission circuits according to the fourth through sixth embodiments, the signal processing section 42 may change the length of the predetermined time period T in accordance with the modulation mode of the transmission signal, in order to further reduce the power consumption of the transmission circuit. FIG. 26 shows the power consumption reduction effect realized when the length of the predetermined time period T is changed. As shown in FIG. 26, part (a), when the envelope of the transmission signal does not change much, the signal processing section 42 cannot provide a large power consumption reduction effect even by shortening the length of the predetermined time period T. Therefore, the signal processing section 42 extends the predetermined time period T. By contrast, as shown in FIG. 26, part (b), when the envelope of the transmission signal changes much, the signal processing section 42 can provide a large power consumption reduction effect by shortening the length of the predetermined time period T. For example, the change in the envelope is larger in the 16QAM mode than in the QPSK modulation mode. Therefore, the signal processing section 42 shortens the predetermined time period T in the 16QAM mode. In this way, the signal processing section 42 can further reduce the power consumption of the transmission circuit.

Each of the transmission circuits according to the fourth through sixth embodiments may further include a distortion compensation section 52 for compensating for the distortion of an amplitude signal and/or a phase signal on the output side of the signal generation section 41. The distortion compensation section 52 is provided in order to compensate for the non-linearity of at least one of the angle modulation section 43, the regulator 44 and the amplitude modulation section 45. FIG. 27 is a block diagram showing an exemplary structure of a transmission circuit 4b including the distortion compensation section 52. Referring to FIG. 27, the distortion compensation section 52 compensates for the amplitude signal and/or the phase signal generated in the signal generation section 41, so as to suppress the distortion occurring thereto in at least one of the angle modulation section 43, the regulator 44 and the amplitude modulation section 45. Thus, the transmission circuit 4b can increase the linearity of the transmission signal more than the transmission circuits described in the fourth through sixth embodiments.

Seventh Embodiment

FIG. 28 is a block diagram showing an exemplary structure of a communication device according to a seventh embodiment of the present invention. Referring to FIG. 28, a communication device 200 according to the seventh embodiment includes a transmission circuit 210, a receiving circuit 220, an antenna duplexer 230, and an antenna 240. The transmission circuit 210 is a transmission circuit described in either one of the first through sixth embodiments. The antenna duplexer 230 transfers a transmission signal which is output from the transmission circuit 210 to the antenna 240 while preventing the transmission signal from leaking to the receiving circuit 220. The antenna duplexer 230 also transfers a receiving signal which is input from the antenna 240 to the receiving circuit 220 while preventing the receiving signal from leaking to the transmission circuit 210.

Accordingly, the transmission signal is output from the transmission circuit 210 and released to the outside from the antenna 240 via the antenna duplexer 230. The receiving signal is received by the antenna 240 and received by the receiving circuit 220 via the antenna duplexer 230. The communication device 200 according to the seventh embodiment uses a transmission circuit according to one of the first through sixth embodiments and thus guarantees the linearity of the transmission signal while realizing a low distortion of a wireless device. Since no branching element such as a directional coupler or the like is provided outside the transmission circuit 210, the loss from the transmission circuit 210 to the antenna 240 can be reduced. Therefore, the power consumption at the time of transmission can be reduced, which allows the communication device 200 to be used for a long period of time as a wireless communication device. The communication device 200 may include only the transmission circuit 210 and the antenna 240.

A transmission circuit according to the present invention is applicable to, for example, a communication device such as a mobile phone, a wireless LAN device or the like.

While the invention has been described in detail, the foregoing description is in all aspects illustrative and not restrictive. It is understood that numerous other modifications and variations can be devised without departing from the scope of the invention.

What is claimed is:

1. A transmission circuit for generating a transmission signal based on input data and outputting the transmission signal, the transmission circuit comprising:
    a signal generation section for generating a vector signal including I and Q signals and an amplitude signal representing a magnitude of the vector signal, based on the input data;
    a vector modulation section for performing vector modulation on the vector signal;
    an amplification section for amplifying the signal processed with vector modulation by the vector modulation section;
    a signal processing section for performing predetermined signal processing on the amplitude signal and outputting the resultant signal; and
    a regulator for controlling a voltage to be supplied to the amplification section based on a magnitude of the signal which is output from the signal processing section;
    wherein:
    the signal processing section:
        holds at least one threshold value and at least two discrete values corresponding to the threshold value; and
        determines whether or not the amplitude signal exceeds the threshold value at an interval of a predetermined time period, selects a discrete value to be output based on the determination result, and outputs a signal having the selected discrete value.

2. A transmission circuit according to claim 1, wherein the predetermined time period is shorter than a time period by which an average output power of the transmission circuit is controlled.

3. A transmission circuit according to claim 1, wherein the signal processing section includes a determination and quantization section for holding at least one threshold value and at least two discrete values corresponding to the threshold value, determining whether or not the amplitude signal exceeds the threshold value at an interval of the predetermined time period, selecting a discrete value to be output based on the determination result, and outputting a signal having the selected discrete value.

4. A transmission circuit according to claim 3, wherein the determination and quantization section includes:
   a maximum amplitude detection section for detecting a maximum value of the amplitude signal at an interval of the predetermined time period; and
   a quantization section for determining whether or not the maximum value of the amplitude signal exceeds the threshold value at an interval of the predetermined time period, selecting a discrete value to be output based on the determination result, and outputting a signal having the selected discrete value.

5. A transmission circuit according to claim 3, wherein:
   the signal generation section further outputs power information which represents a magnitude of a transmission power of the transmission signal;
   the transmission circuit further comprises a variable gain amplification section for amplifying the signal processed with vector modulation by the vector modulation section with a gain in accordance with the power information; and
   the signal processing section further includes a multiplication section for multiplying the power information and the amplitude signal to output an amplitude signal having a magnitude controlled in accordance with the power information to the determination and quantization section.

6. A transmission circuit according to claim 3, wherein:
   the signal generation section further outputs power information which represents a magnitude of a transmission power of the transmission signal;
   the transmission circuit further comprises a variable gain amplification section for amplifying the signal processed with vector modulation by the vector modulation section with a gain in accordance with the power information; and
   the signal processing section changes levels of the threshold value and the discrete values based on the power information.

7. A transmission circuit according to claim 6, wherein the signal processing section changes the levels of the threshold value and the discrete values so as to be in inverse proportion to the square root of the magnitude of the transmission power.

8. A transmission circuit according to claim 6, wherein the signal processing section changes the levels of the threshold value and the discrete values, referring to table information in which the levels of the threshold value and the discrete values are preset to be optimum in correspondence with the magnitude of the transmission power.

9. A transmission circuit according to claim 1, further comprising a distortion compensation section for compensating for the vector signal generated by the signal generation section so as to suppress a distortion occurring to the vector signal in the amplification section.

10. A transmission circuit according to claim 1, wherein the regulator is a series regulator.

11. A transmission circuit according to claim 1, wherein the regulator is a switching regulator.

12. A transmission circuit according to claim 1, wherein:
   the regulator includes:
      a series regulator for supplying a voltage controlled in accordance with the magnitude of the signal which is output from the signal processing section to the amplification section;
      a calculation section for performing predetermined calculation processing on the signal which is output from the signal processing section and outputting the resultant signal; and
      a switching regulator for supplying a voltage controlled in accordance with a magnitude of the signal which is output from the calculation section to the series regulator;
   wherein the calculation section performs calculation processing on the signal which is output from the signal processing section, such that the voltage which is output from the switching regulator is higher than the voltage which is output from the series regulator.

13. A communication device, comprising:
   a transmission circuit for generating a transmission signal; and
   an antenna for outputting the transmission signal generated by the transmission circuit;
   wherein the transmission circuit is a transmission circuit according to claim 1.

14. A communication device according to claim 13, further comprising:
   a receiving circuit for processing a receiving signal received from the antenna; and
   an antenna duplexer section for outputting the transmission signal generated by the transmission circuit to the antenna, and outputting the receiving signal received from the antenna to the receiving circuit.

15. A transmission circuit for generating a transmission signal based on input data and outputting the transmission signal, the transmission circuit comprising:
   a signal generation section for generating a vector signal including I and Q signals, based on the input data;
   a vector modulation section for performing vector modulation on the vector signal;
   a dividing section for dividing the signal processed with vector modulation by the vector modulation section;
   an amplification section for amplifying one of the signals divided by the dividing section;
   a detection section for detecting a magnitude of an envelope of the other of the signals divided by the dividing section and outputting the detection result as an amplitude signal;
   a signal processing section for performing predetermined signal processing on the amplitude signal and outputting the resultant signal; and
   a regulator for controlling a voltage to be supplied to the amplification section based on a magnitude of the signal which is output from the signal processing section;
   wherein:
   the signal processing section:
      holds at least one threshold value and at least two discrete values corresponding to the threshold value; and
      determines whether or not the amplitude signal exceeds the threshold value at an interval of a predetermined time period, selects a discrete value to be output based on the determination result, and outputs a signal having the selected discrete value.

16. A transmission circuit for generating a transmission signal based on input data and outputting the transmission signal, the transmission circuit comprising:
   a signal generation section for generating an amplitude signal and an angle modulated signal based on the input data;
   an amplitude modulation section for performing amplitude modulation on the angle modulated signal;

a series regulator for controlling a voltage to be supplied to the amplitude modulation section based on a magnitude of the amplitude signal generated by the signal generation section;

a signal processing section for performing predetermined signal processing on the amplitude signal generated by the signal generation section and outputting the resultant signal; and a switching regulator for controlling a voltage to be supplied to the series regulator based on a magnitude of the signal which is output from the signal processing section;

wherein the signal processing section:

holds at least one threshold value and at least two discrete values corresponding to the threshold value; and determines whether or not the amplitude signal exceeds the threshold value at an interval of a predetermined time period, selects a discrete value to be output by which based on the determination result, and outputs a signal having the selected discrete value.

17. A transmission circuit according to claim 16, wherein the predetermined time period is shorter than a time period by which an average output power of the transmission circuit is controlled.

18. A transmission circuit according to claim 16, wherein the signal processing section includes a determination and quantization section for holding at least one threshold value and at least two discrete values corresponding to the threshold value, determining whether or not the amplitude signal exceeds the threshold value at an interval of the predetermined time period, selecting a discrete value to be output based on the determination result, and outputting a signal having the selected discrete value.

19. A transmission circuit according to claim 16, wherein:

the signal generation section further outputs power information which represents a magnitude of a transmission power of the transmission signal;

the transmission circuit further comprises a multiplication section for multiplying the amplitude signal generated by the signal generation section and the power information on a stage post to the signal generation section;

the series regulator controls a voltage to be supplied to the amplitude modulation section based on the magnitude of the amplitude signal which is input thereto via the multiplication section; and the signal processing section determines whether or not the amplitude signal which is input thereto via the multiplication section exceeds the threshold value at an interval of a predetermined time period, selects a discrete value to be output based on the determination result, and outputs a signal having the selected discrete value.

20. A transmission circuit according to claim 16, wherein the signal processing section changes a length of the predetermined time period in accordance with a changing width of an envelope of the transmission signal.

21. A transmission circuit according to claim 20, wherein when the changing width of the envelope of the transmission signal is small, the signal processing section shortens the predetermined time period; and when the changing width of the envelope of the transmission signal is large, the signal processing section extends the predetermined time period.

22. A transmission circuit according to claim 16, wherein the signal processing section changes a length of the predetermined time period in accordance with a modulation mode of the transmission signal.

23. A transmission circuit according to claim 16, further comprising a distortion compensation section, on an output side of the signal generation section, for compensating for at least one of the amplitude signal and the angle modulated signal so as to suppress a distortion occurring thereto in at least one of the switching regulator, the series regulator and the amplitude modulation section.

24. A communication device, comprising:

a transmission circuit for generating a transmission signal; and an antenna for outputting the transmission signal generated by the transmission circuit;

wherein the transmission circuit is a transmission circuit according to claim 16.

25. A communication device according to claim 24, further comprising:

a receiving circuit for processing a receiving signal received from the antenna; and an antenna duplexer section for outputting the transmission signal generated by the transmission circuit to the antenna, and outputting the receiving signal received from the antenna to the receiving circuit.

* * * * *